(12) United States Patent
Kang

(10) Patent No.: US 6,829,154 B1
(45) Date of Patent: Dec. 7, 2004

(54) LAYOUT OF FERROELECTRIC MEMORY DEVICE

(75) Inventor: Hee Bok Kang, Daejeon (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 10/608,487

(22) Filed: Jun. 30, 2003

(30) Foreign Application Priority Data

Nov. 8, 2002 (KR) .................................. 10-2002-0069180

(51) Int. Cl.[7] .............................................. G11C 11/22
(52) U.S. Cl. ........................................ 365/145; 365/63
(58) Field of Search .......................... 365/145, 63, 51, 365/52, 205, 149

(56) References Cited

U.S. PATENT DOCUMENTS

| 6,091,622 A * | 7/2000 | Kang .......................... 365/145 |
| 6,246,603 B1 * | 6/2001 | Brady ......................... 365/145 |
| 6,438,029 B2 | 8/2002 | Hiraki et al. |
| 6,449,197 B1 | 9/2002 | Hiraki et al. |
| 6,538,929 B2 | 3/2003 | Hiraki et al. |
| 6,542,414 B2 | 4/2003 | Hiraki et al. |
| 6,594,174 B2 * | 7/2003 | Choi et al. .................. 365/145 |
| 6,646,903 B2 * | 11/2003 | Chow ......................... 365/145 |
| 6,690,600 B1 * | 2/2004 | Kang .......................... 365/145 |

* cited by examiner

Primary Examiner—Anh Phung
(74) Attorney, Agent, or Firm—Heller Ehrman White and McAuliffe LLP

(57) ABSTRACT

The present invention relates to a ferroelectric memory device comprising a cell array block, a data bus unit and a control circuit unit. The cell array block has a bitline structure including a main bitline and a plurlaity of sub bitlines. The main bitline is connected to a column selection controller, and the plurality of sub-bitlines have both terminals connected to the main bitline, respectively, and connected to a plurality of unit cells. The data bus unit is connected to the column selection controller. The control circuit unit includes a sense amplifier array connected between a data I/O buffer and a sense amplifier data bus connected to the data bus unit. A plurality of the cell array blocks are arranged like a matrix. The control circuit unit is disposed in a first center line of symmetry wherein the first center line is parallel to the main bitline, and the data bus unit is disposed in a second center line of symmetry wherein the second center line is vertical to the main bitline.

The layout of the disclosed memory device allows capacitance load of a data bus to be minimized in a highly integrated circuit, thereby embodying a high-speed FRAM.

20 Claims, 23 Drawing Sheets

LAYOUT OF FERROELECTRIC MEMORY DEVICE

BACKGROUND OF THE INVENTION

1. Field of the Invention

The present invention relates to a ferroelectric memory device, and more specifically, to an effective arrangement of cell arrays and control circuits to improve the integration of a chip and minimize delay factors of signals.

2. Description of the Related Art

Generally, a ferroelectric random access memory (hereinafter, referred to as 'FRAM') has attracted considerable attention as next generation memory device because it has a data processing speed as fast as a DRAM (Dynamic Random Access Memory) and conserves data even after the power is turned off.

The FRAM includes capacitors similar to the DRAM, but the capacitors have a ferroelectric substance for utilizing the characteristic of a high residual polarization of the ferroelectric substance in which data is not low even after eliminating an electric field applied thereto.

FIG. 1 is a characteristic curve illustrating a hysteresis loop of a general ferroelectric substance. As shown in FIG. 1, a polarization induced by an electric field does not vanish but keeps some strength ('d' or 'a' state) even after the electric field is cleared due to existence of a residual (or spontaneous) polarization. These 'd' and 'a' states may be assigned to binary values of '1' and '0' for use as a memory cell.

FIG. 2 is a structural diagram illustrating a unit cell of the FRAM device. As shown in FIG. 2, the unit cell of the conventional FRAM is provided with a bitline BL arranged in one direction and a wordline WL arranged in another direction vertical to the bitline BL. A plateline PL is arranged parallel to the wordline and spaced at a predetermined interval. The unit cell is also provided with a transistor T1 having a gate connected to an adjacent wordline WL and a source connected to an adjacent bitline BL, and a ferroelectric capacitor FC1 having the first terminal of the two terminals connected to the drain terminal of the transistor T1 and the second terminal of the two terminals connected to the plateline PL.

FIG. 3a is a timing diagram illustrating a write mode of the conventional FRAM.

Referring to FIG. 3a, when a chip enable signal CSBpad applied externally transits from a high to low level and simultaneously a write enable signal WEBpad also transits from a high to low level, the array is enabled to start a write mode. Thereafter, when an address is decoded in a write mode, a pulse applied to a corresponding wordline transits from a "low" to "high" level, thereby selecting the cell.

In order to write a binary logic value "1" in the selected cell, a "high" signal is applied to a bitline BL while a "low" signal is applied to a plateline PL. In order to write a binary logic value "0" in the cell, a "low" signal is applied to a bitline BL while a "high" signal is applied to a plateline PL.

FIG. 3b is a timing diagram illustrating a read mode of the conventional FRAM. Referring to FIG. 3b, when a chip enable signal CSBpad externally transits from a "high" to "low" level, all bitlines are equalized to a "low" level by an equalization signal before selection of a required wordline.

After each bitline is deactivated, an address is decoded to transit a signal on the required wordline from a "low" to "high" level, thereby selecting a corresponding unit cell. A "high" signal is applied to a plateline of the selected cell to cancel a data Qs corresponding to the logic value "1" stored in the FRAM. If the logic value "0" is stored in the FRAM, a corresponding data Qns will not be destroyed.

The destroyed and non-destroyed data output different values, respectively, according to the above-described hysteresis loop characteristics. As a result, a sense amplifier senses logic values "1" or "0". In other words, as shown in the hysteresis loop of FIG. 1, the state moves from 'd' to 'f' when the data is destroyed while the state moves from 'a' to 'f' when the data is not destroyed.

As a result, the destroyed data amplified by the enabled sense amplifier outputs a logic value "1" while the non-destroyed data amplified by the sense amplifier outputs a logic value "0". The original data is destroyed after the sense amplifier amplifies the data. Accordingly, when a "high" signal is applied to the required wordline, the plateline is disabled from "high" to "low", thereby recovering the original data.

SUMMARY OF THE INVENTION

Cell arrays and control circuits should be effectively arranged to embody a highly integrated FRAM operating at a high speed.

Accordingly, it is a first object of the present invention to maximize the efficiency of a layout by arranging adjacent circuits such as a pad array, a sense amplifier array and an address buffer in a center of symmetry of a cell array block, and symmetrically arranging data bus units perpendicular to the other center of symmetry of the cell array block.

It is a second object of the present invention to allow data to be effectively restored and written in the FRAM by controlling a sense amplifier using a column selection signal.

It is a third object of the present invention to supply a VPP to each cell array block at a high speed by dividing VPP-related circuits involved in the cell operation into a gate control-related VPP circuit of a small capacity and a VPP pump circuit of a large capacity, and effectively arranging them.

It is a fourth object of the present invention to provide a layout of a connection portion between the data bus unit and the cell array block, which increases process margin and signal transmission efficiency and minimizes a required area.

There is provided a ferroelectric memory device, comprises a cell array block, a data bus unit and a control circuit unit. The cell array block has a bitline structure including a main bitline and a plurlaity of sub bitlines. The main bitline is connected to a column selection controller, and the plurality of sub-bitlines have both terminals connected to the main bitline, respectively, and connected to a plurality of unit cells. The data bus unit is connected to the column selection controller. The control circuit unit includes a sense amplifier array connected between a data I/O buffer and a sense amplifier data bus connected to the data bus unit. A plurality of the cell array blocks are arranged like a matrix. The control circuit unit is disposed in a first center line of symmetry wherein the first center line is parallel to the main bitline, and the data bus unit is disposed in a second center line of symmetry wherein the second center line is vertical to the main bitline.

DETAILED DESCRIPTION OF THE PREFERRED EMBODIMENTS

The present invention will be described in detail with reference to the accompanying drawings.

Figure 1:
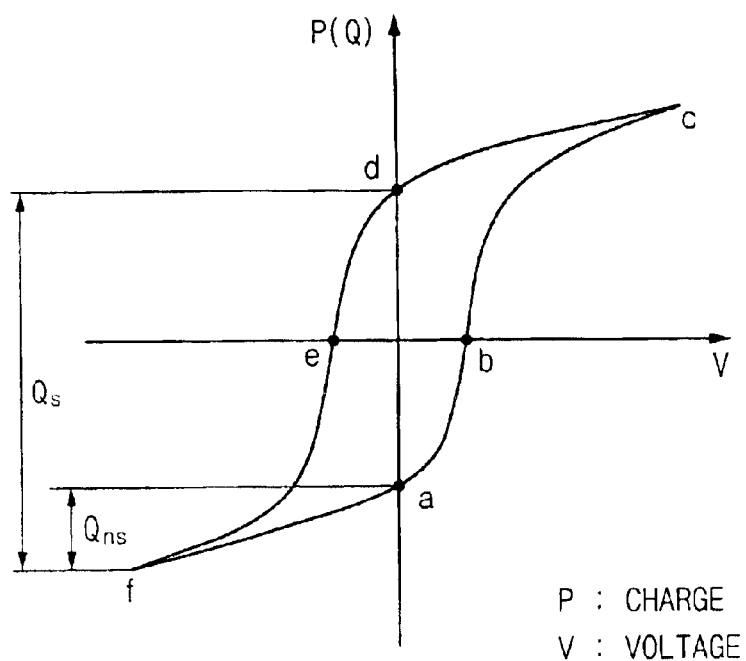
FIG. 1 is a characteristic curve illustrating a hysteresis loop of a general ferroelectric substance.
Figure 2:
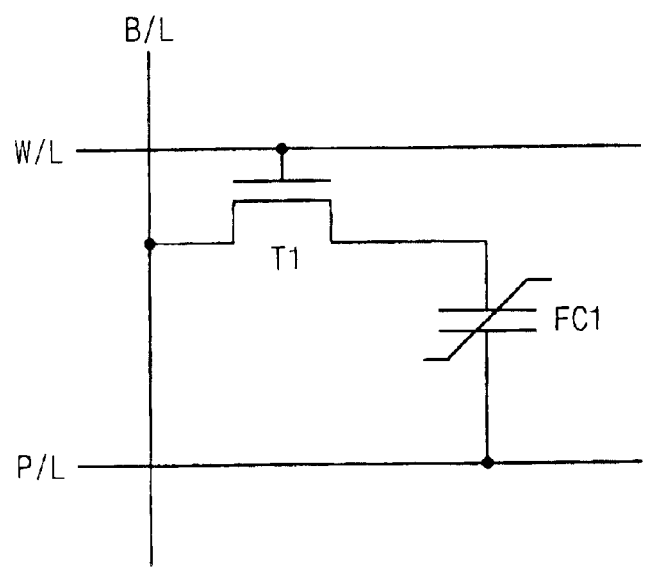
FIG. 2 is a structural diagram illustrating a conventional FRAM cell device.
Figure 3A:
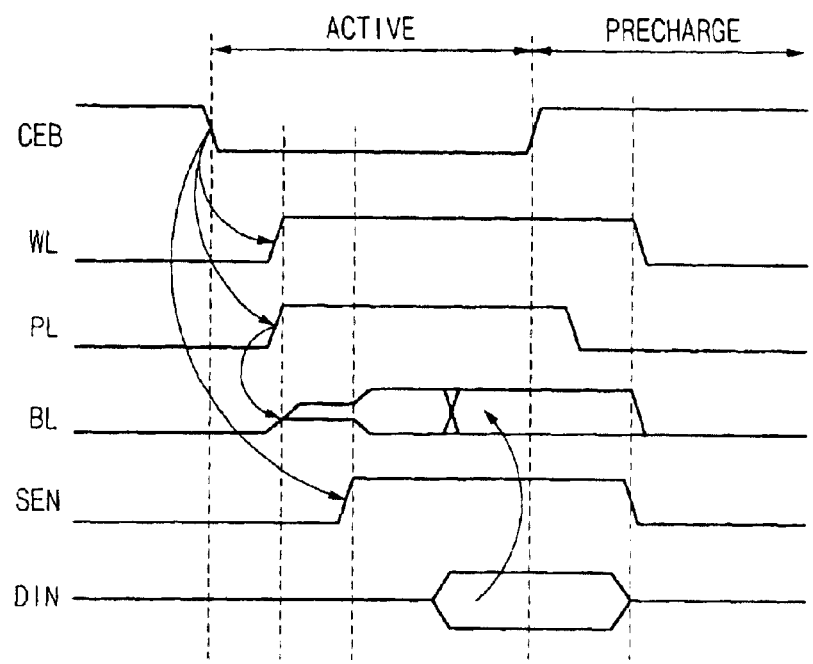
FIGS. 3a and 3b are timing diagrams illustrating read and write operations of a conventional FRAM.
Figure 3B:
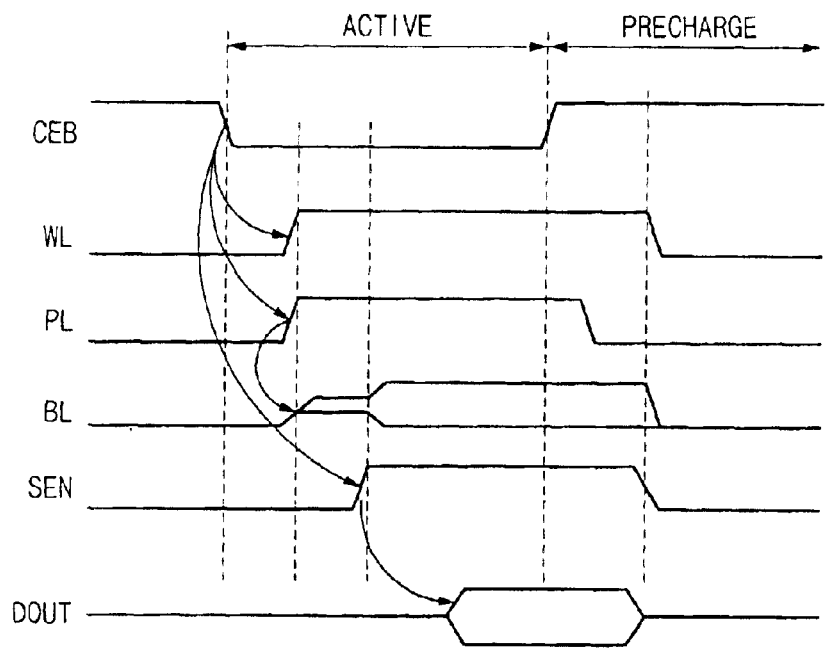
Figure 4:
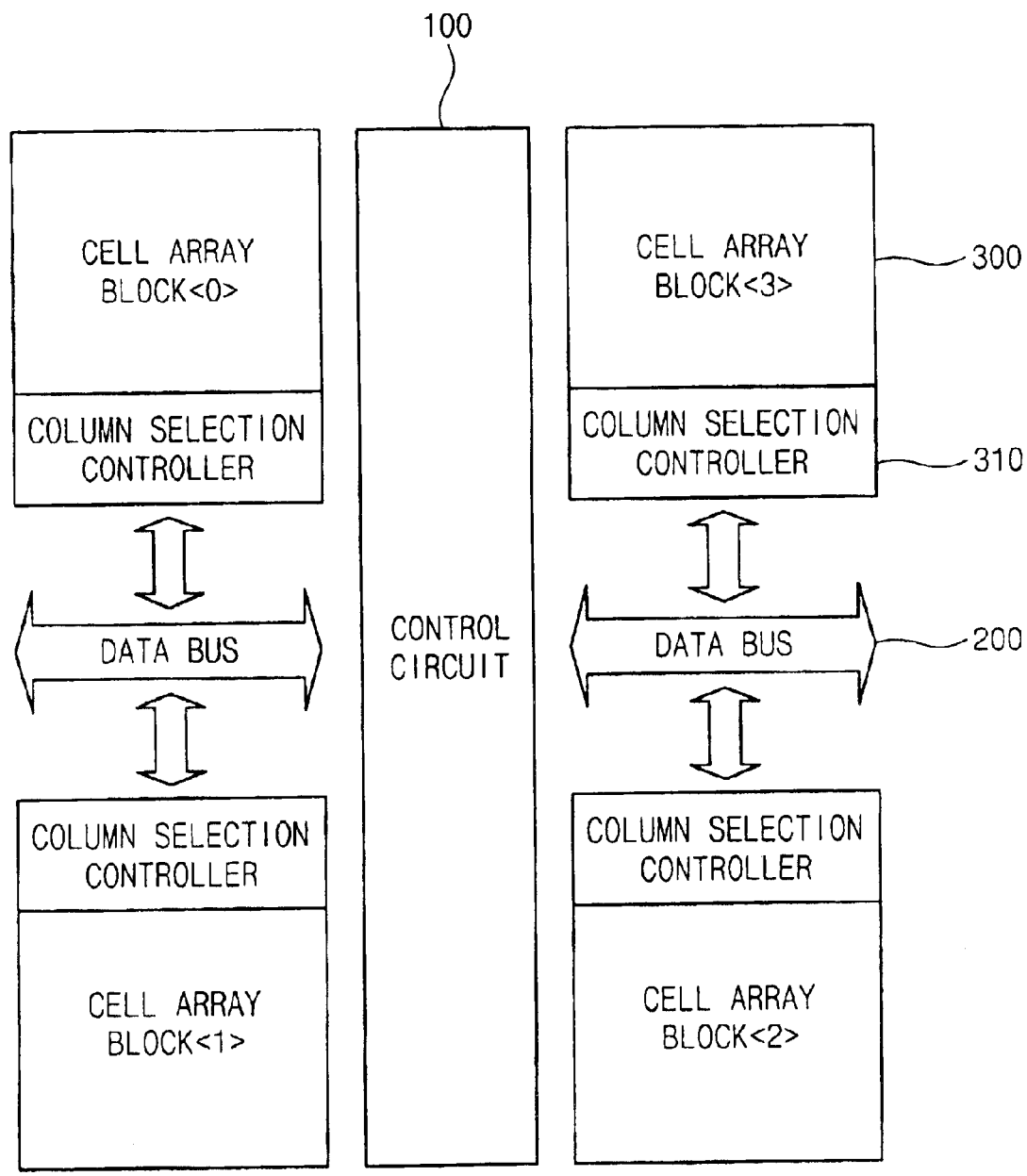
FIG. 4 is a block diagram of a FRAM according to the present invention.

FIG. 4 is a block diagram of a FRAM according to the present invention. Four cell array blocks 300 are arranged as a 2×2 matrix format in a chip. A control circuit unit 100 including an address input pad, a buffer, a decoder and a sense amplifier array is arranged between a first row and a second row of the matrix. A data bus unit 200 is arranged between a first column and a second column of the matrix. A bitline (not shown) of a cell array block 300 is connected to a data bus line in the data bus unit 200 through a column selection controller 310.

Figure 5:
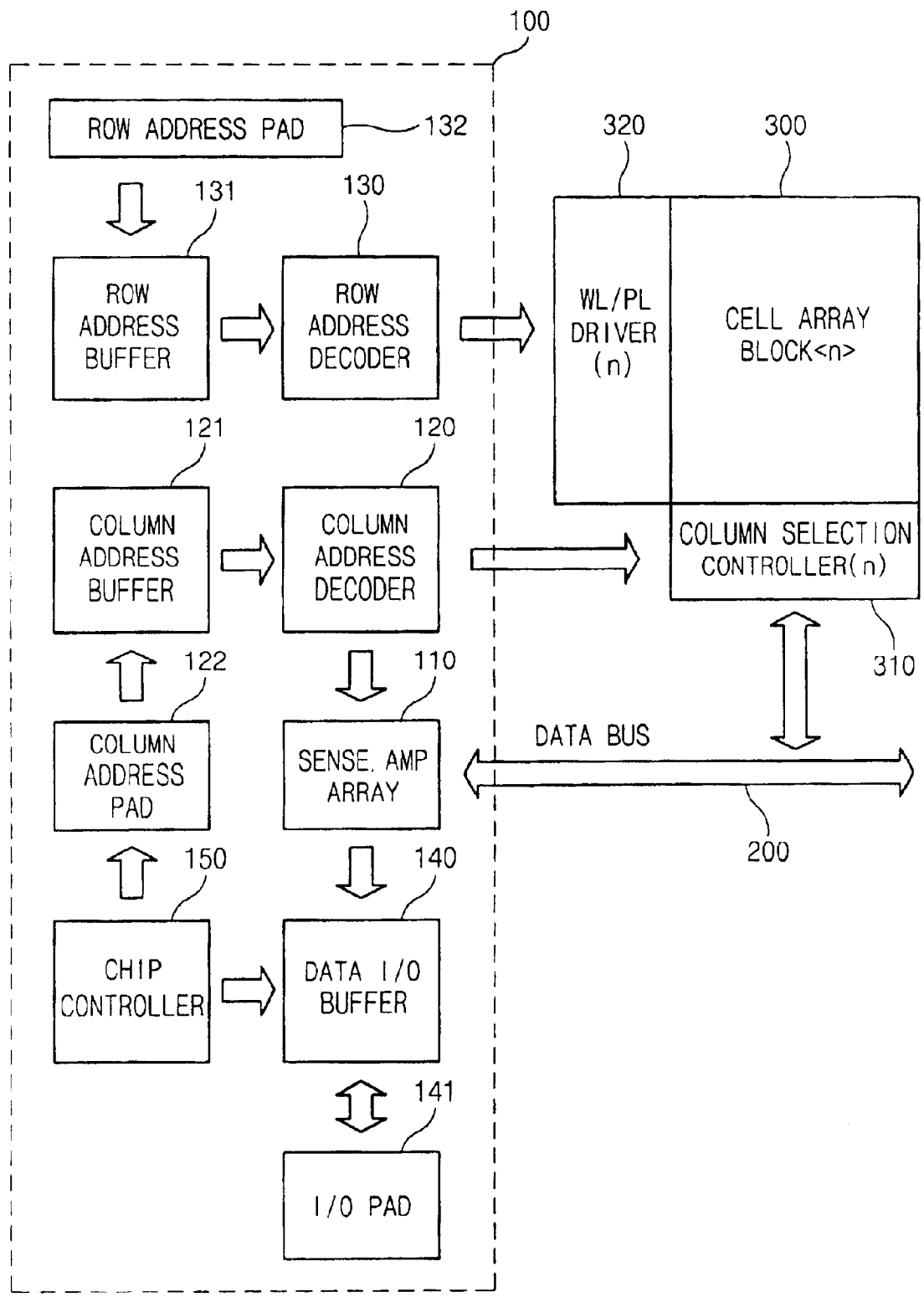
FIG. 5 is a structural diagram illustrating a control circuit unit and a cell array block of FIG. 4.

FIG. 5 is a detailed structural diagram illustrating the control circuit unit of FIG. 4. The control circuit unit 100 comprises a sense amplifier array 100, a column address pad 122, a column address buffer 121, a column address decoder 120, a row address pad 112, a row address buffer 131, a row address decoder 130, an I/O pad 141, a data I/O buffer 140, and a chip controller 150. The sense amplifier array 110 includes a plurality of sense amplifiers. A column address is inputted into the column address pad 122, stored in the column address buffer 121, and decoded by the column address decoder 120. A row address is inputted into the row address pad 112, stored in the row address buffer 131, and decoded by the row address decoder 130. Data is inputted or outputted at the I/O pad 141, and stored in the data I/O buffer 140. The chip controller 150 controls the operation of a chip.

An output signal from the row address decoder 130 controls a wordline/plateline driver 320 to output a driving voltage to a wordline and a plateline in read/write operations.

Figure 6:
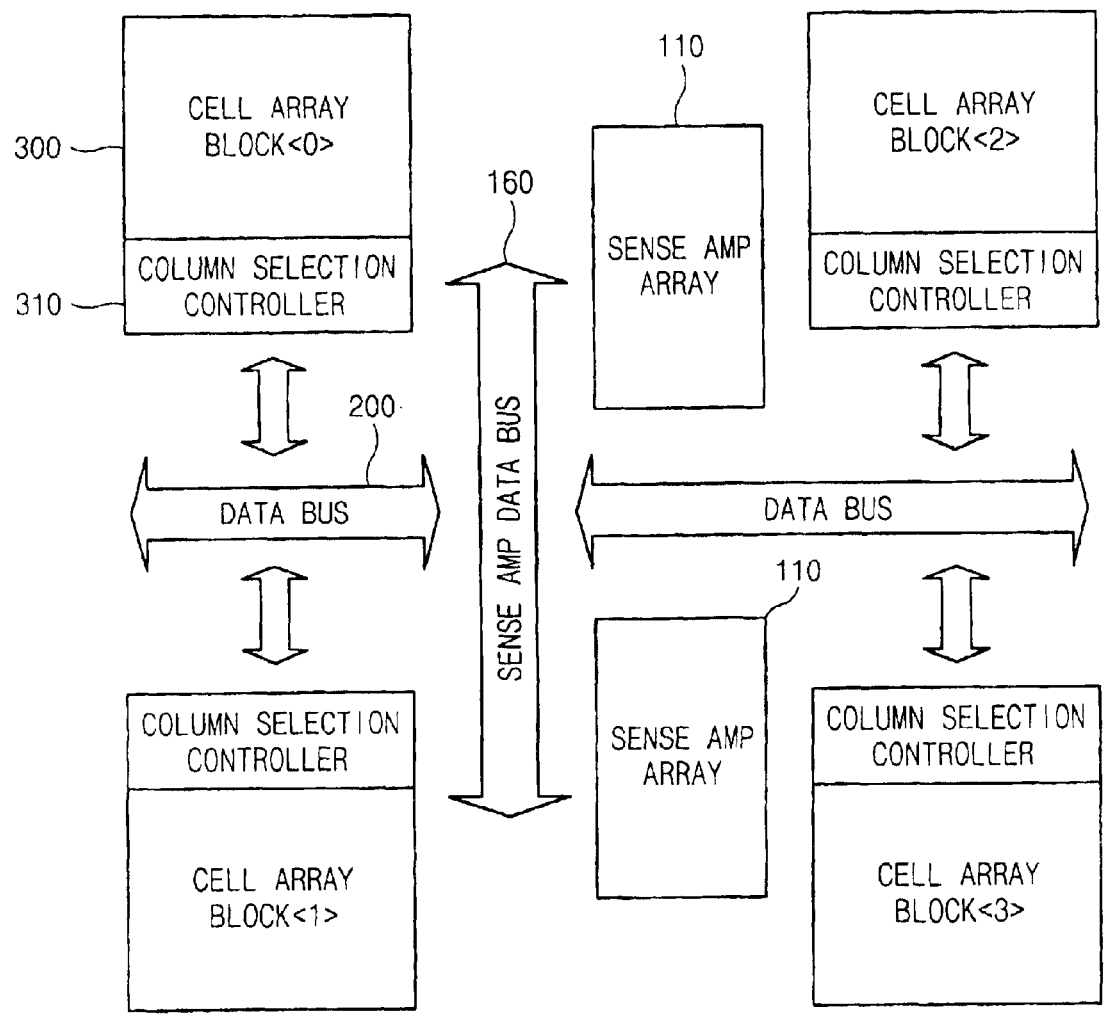
FIG. 6 is a circuit diagram illustrating a sense amplifier array unit and a sense amplifier data bus unit included in the control circuit unit of FIG. 4.

FIG. 6 is a block diagram illustrating the sense amplifier array 110 in the control circuit unit 100 of FIG. 4, and a sense amplifier data bus unit 160 for connecting a data bus unit 200 to the sense amplifier array 110. Each sense amplifier in the sense amplifier array 110 shares the data bus unit 200.

There are various methods for connecting the data bus unit 200 to the sense amplifier array 110, which are explained below.

Figure 7:
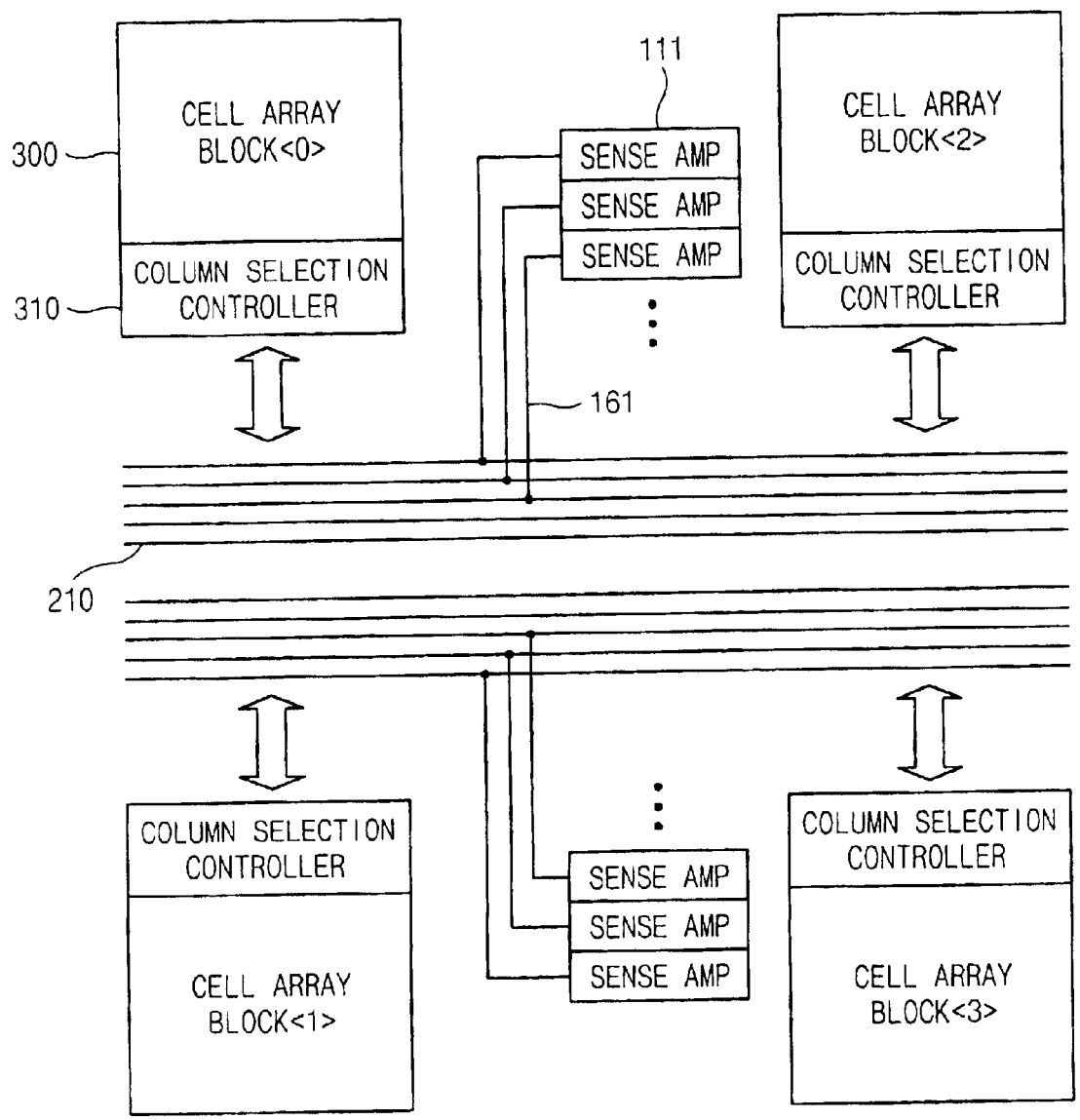
FIG. 7 is a diagram illustrating a first example of connection between the sense amplifier array unit and a data bus unit of FIG. 6.

FIG. 7 is a diagram illustrating a first example of connection between the sense amplifier array unit 110 and the data bus unit 200 of FIG. 6. Each sense amplifier 111 in the sense amplifier array 110 is connected to a sense amplifier data bus line 161 in the sense amplifier data bus 160. The sense amplifier data bus line 161 is directly connected to a data bus line 210 in the data bus unit 200.

Figure 8A:
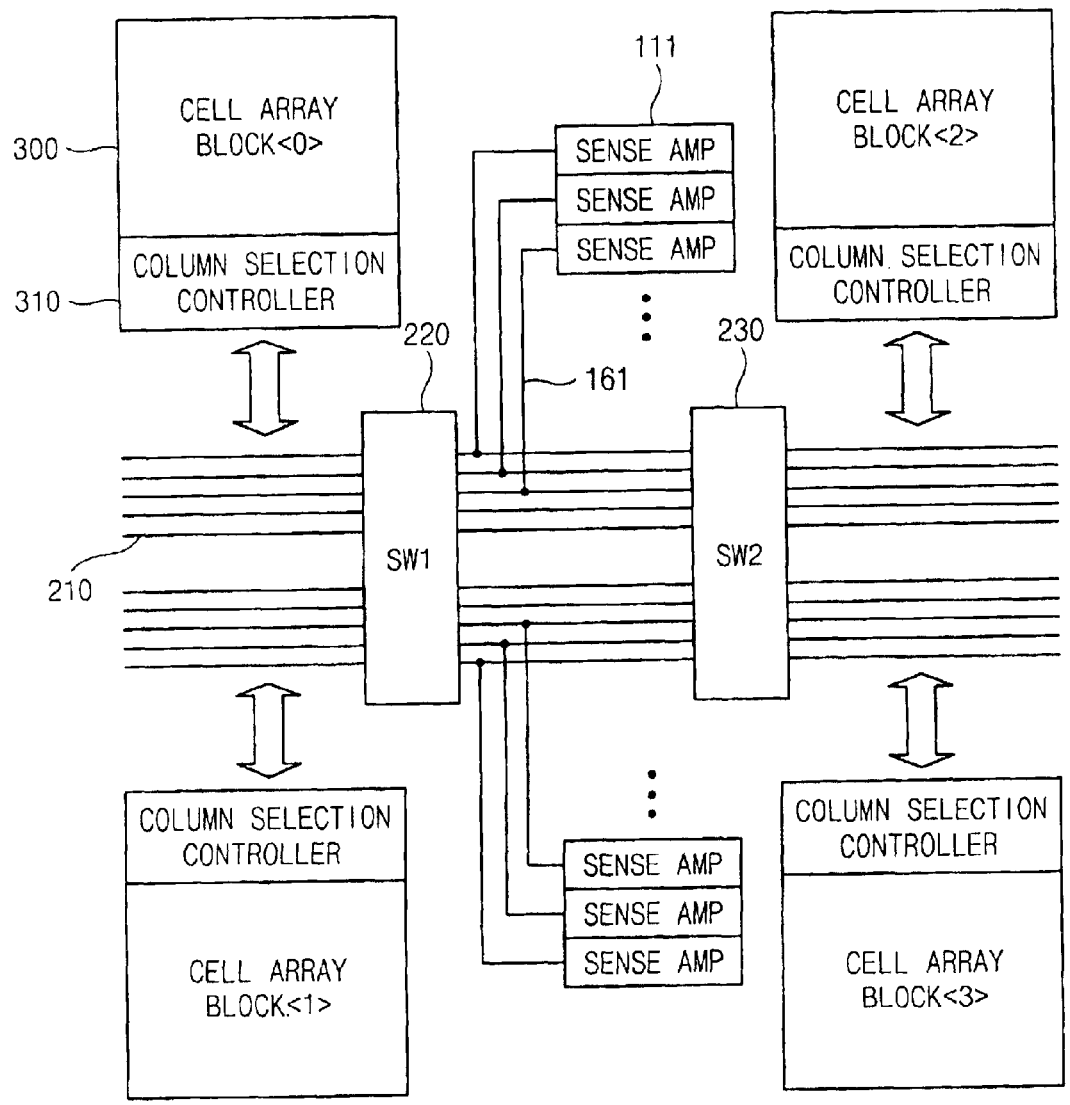
FIGS. 8a and 8b are diagrams illustrating a second example of connection between the sense amplifier array unit and the data bus unit of FIG. 6.

FIG. 8a is a diagram illustrating a second example of connection between the sense amplifier array unit 110 and the data bus unit 200 of FIG. 6. Switches SW1 and SW2 are arranged apart in the middle portion of the data bus unit 200. The sense amplifier data bus line 161 corresponding to each sense amplifier 111 is directly connected to the corresponding data bus line 210 between the switches SW1 and SW2. The sense amplifier 11 is connected to the right or left side of the data bus unit by the complementary switching operations of SW1 and SW2.

Figure 8B:
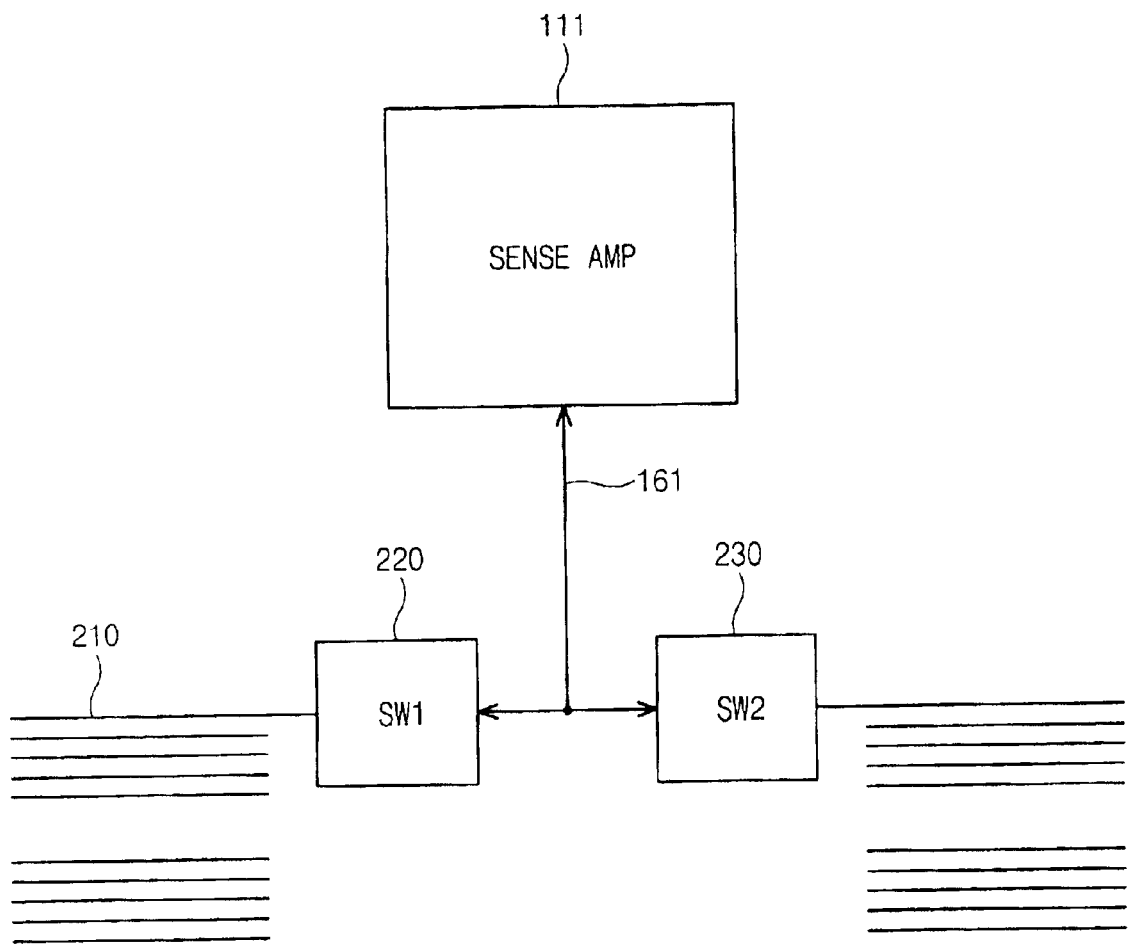

FIG. 8b shows the enlarged connection portion of FIG. 8a.

Figure 9A:
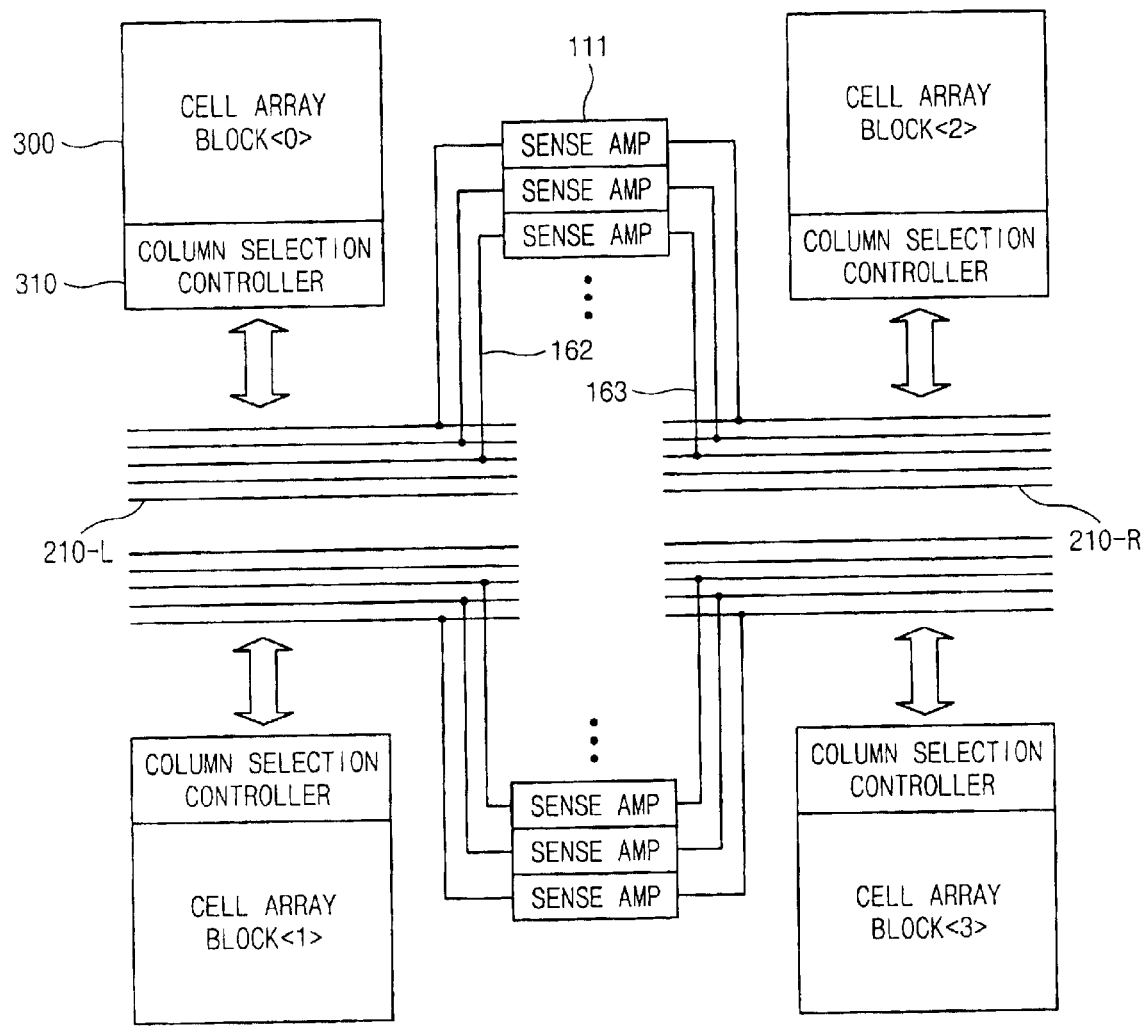
FIGS. 9a and 9b are diagrams illustrating a third example of connection between the sense amplifier array unit and the data bus unit of FIG. 6.

FIG. 9a is a diagram illustrating a third example of connection system between the sense amplifier array unit 110 and the data bus unit 200 of FIG. 6. Unlike the second example, the data bus unit 200 is divided into a first data bus unit on the left side and a second data bus unit on the right side in the third example. The sense amplifier data bus is also divided into a first sense amplifier data bus connected to the first data bus unit and a second sense amplifier data bus connected to the second data but unit.

A data bus line 162 in the first sense amplifier data bus is directly connected to a first data bus line 210-L in the first data bus unit. A data bus line 163 in the second sense amplifier data bus is directly connected to a second data bus line 210-R in the second data bus unit.

Figure 9B:
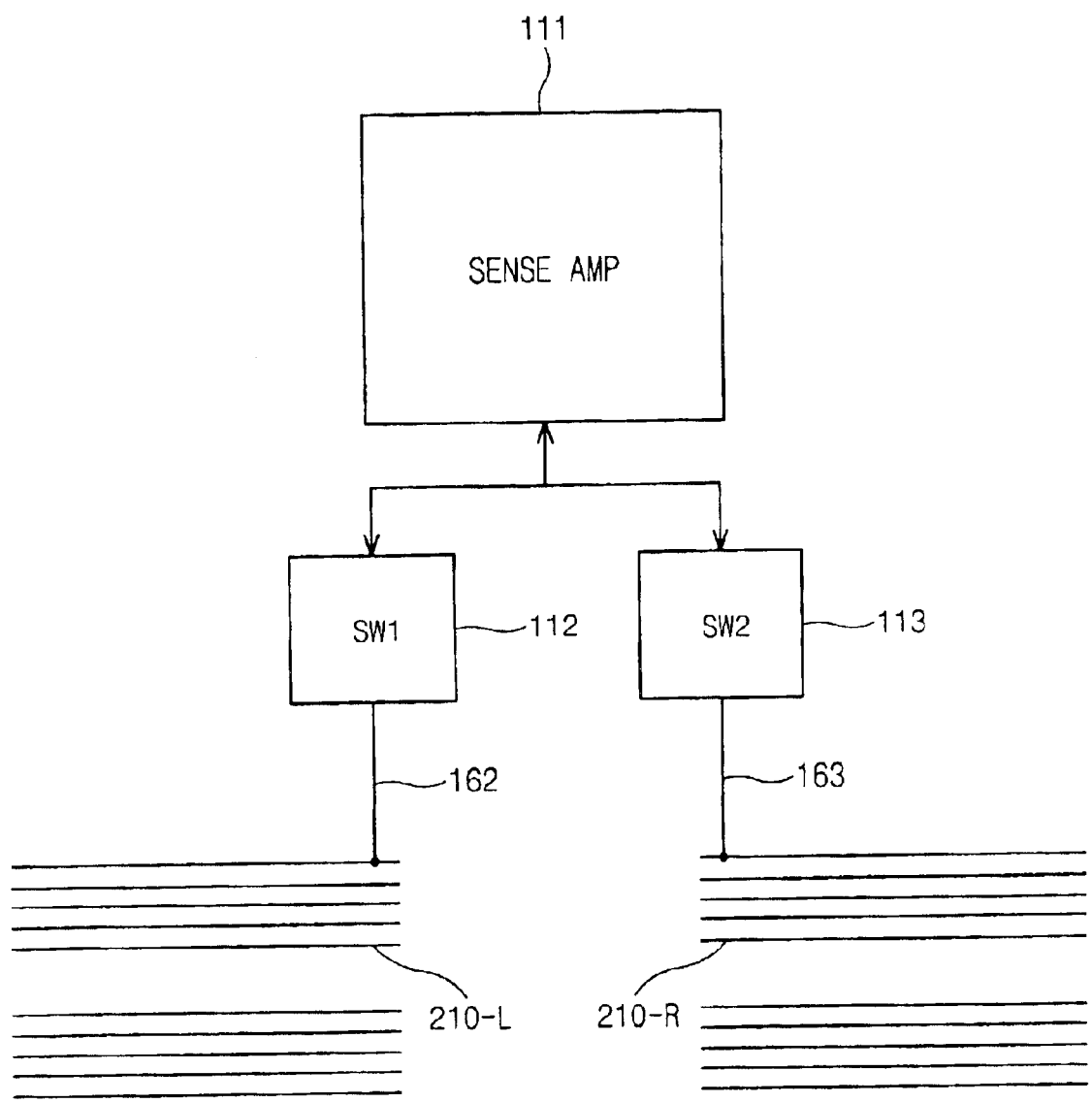

FIG. 9b shows the enlarged connection portion of FIG. 9a. A first switch SW1 is connected to each data bus line 162 in the first sense amplifier data bus. A second switch SW2 is connected to each data bus line 163 in the second sense amplifier data bus. The switches SW1 and SW2 are connected to the same port of the sense amplifier 111. The structure of the sense amplifier 11 will be explained in detail later. The sense amplifier 11 is connected to the first sense amplifier data bus line 162 or the second sense amplifier data bus line 163 by the complementary switching operations of SW1 and SW2.

Figure 10:
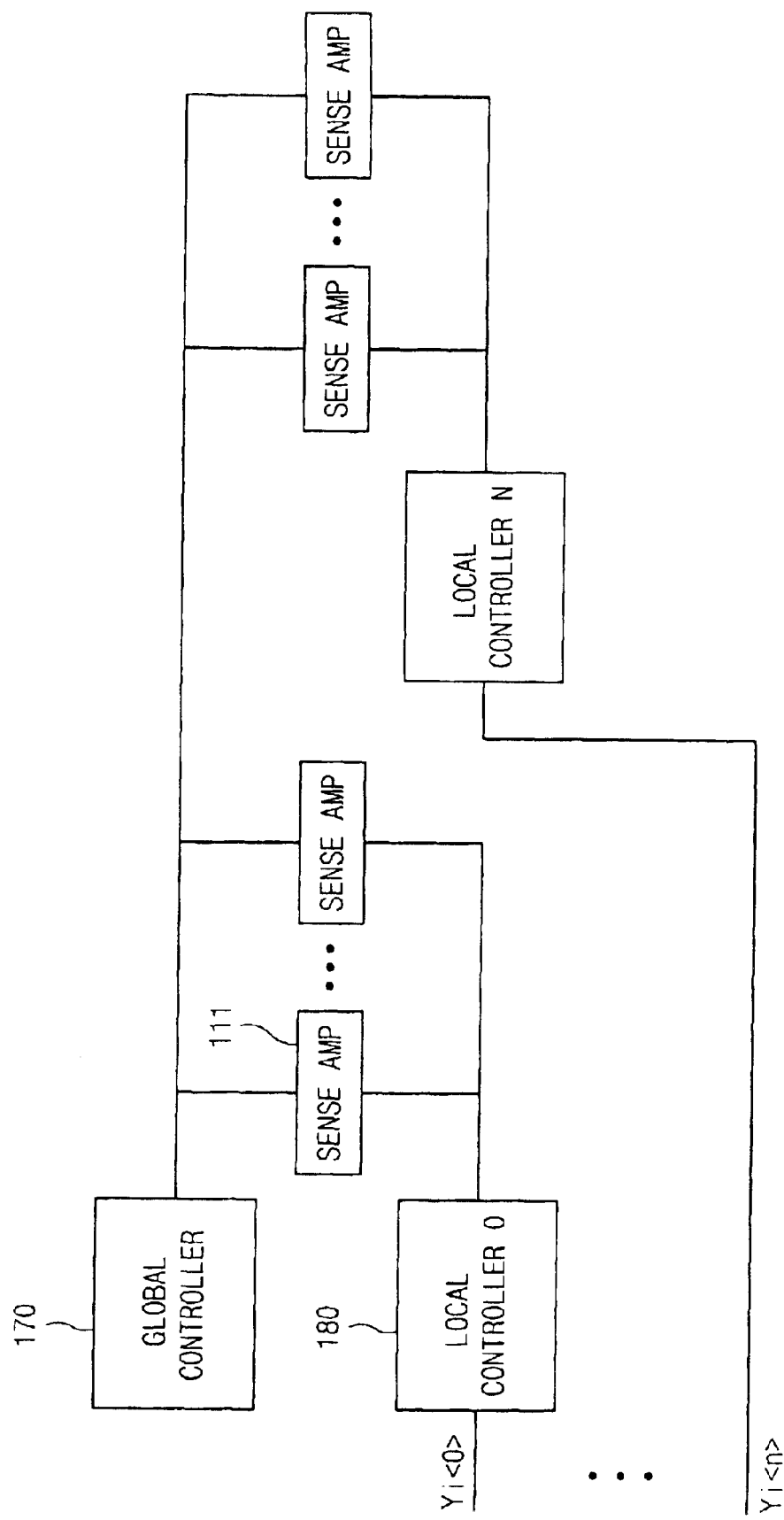
FIG. 10 is a block diagram illustrating a global controller and a local controller for controlling sense amplifiers.

FIG. 10 is a block diagram illustrating a global controller and a local controller for controlling the sense amplifier according to the present invention. A control signal inputted to the sense amplifier 11 is generated from a global controller 170 and a local controller 180. The global controller 170 outputs a common control signal into all sense amplifiers 111 in the sense amplifier array. The local controller 180, which is located in each sub sense amplifier array of a sense amplifier array, outputs a common control signal into a plurality of the sense amplifiers 111 in the sub sense amplifier array. The local controller 180 is controlled by a column address bit Yi<n> while the global controller 170 generates a control signal regardless of a column address bit.

The sense amplifiers 111 selected by the column address bit start read or write modes. Since a read mode is necessarily accompanied with a restore mode, the sense amplifier 111 selected by the column address bit performs a restore or write operation. However, the rest sense amplifiers 111, which are not selected by the column address bit, start only a read mode with a restore mode.

As a result, the global controller 170 outputs a signal which is commonly used in read and write modes. The local controller 180 generates a control signal for performing read and write modes into the selected sense amplifier 111, and a control signal for performing only a read mode into the unselected sense amplifier 111.

The specific operation of the sense amplifier 111 and its control signals will be explained below.

Figure 11A:
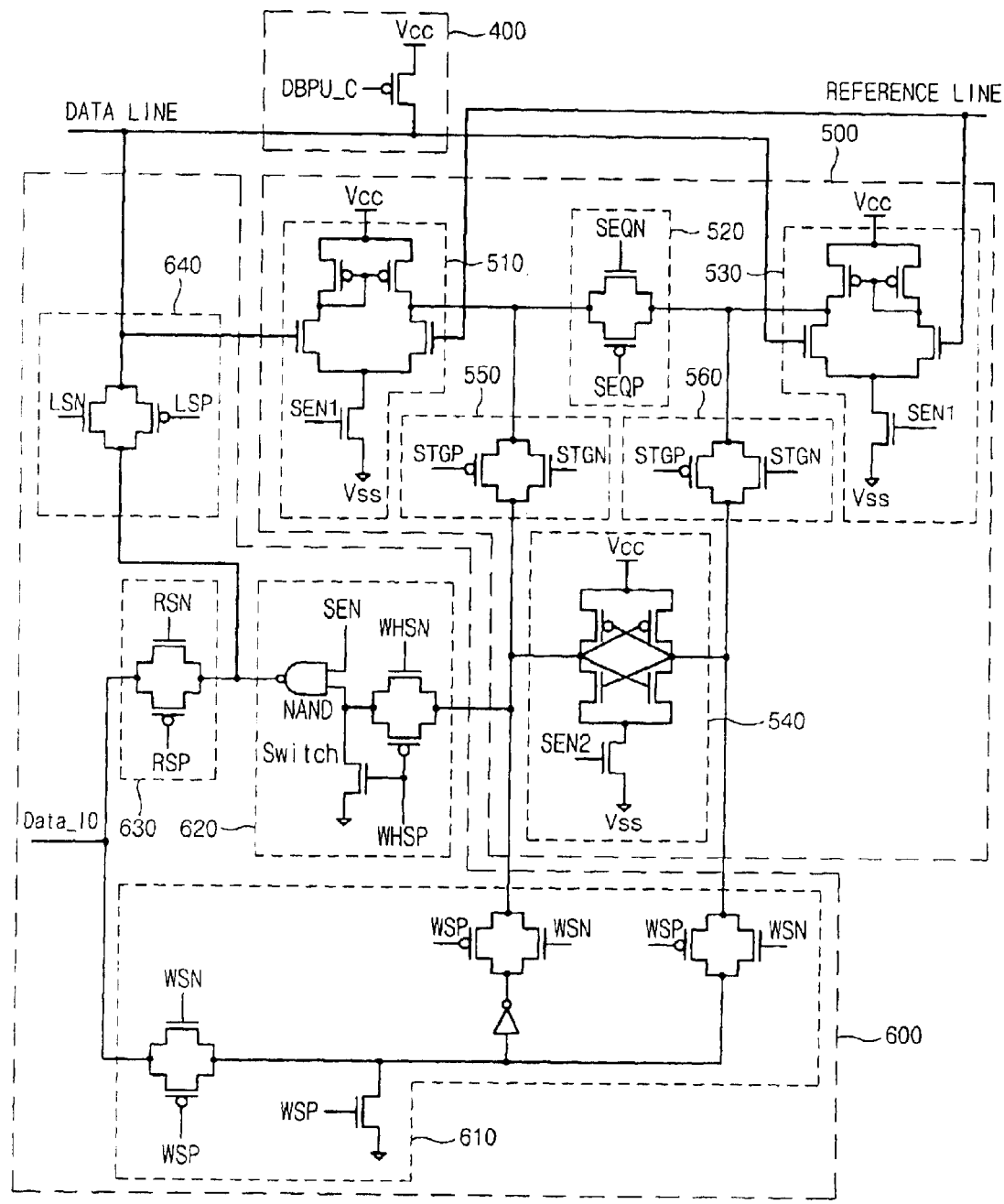
FIGS. 11a and 11b are circuit diagrams illustrating the sense amplifier of FIG. 10.

FIG. 11a is a circuit diagram illustrating the sense amplifier 111 of FIG. 10. The sense amplifier 111 comprises a data line pull-up controller 400, an amplification unit 500, and an I/O controller 600.

The data line pull-up controller 400 pulls up a voltage of a data line to a VCC in response to a control signal DBPU_C. The data line is connected to a sense amplifier data bus line.

The amplification unit 500 comprises a first comparator 510, a second comparator 530, an equalizer 520, and a storage unit 540. The first comparator 510 compares a signal of a data line with that of a reference line, and outputs a high level signal when the signal of the data line is higher than that of the reference line. The second comparator 530 outputs an opposite level signal to the first comparator 510. The equalizer 520 equalizes a voltage from an output unit of the first comparator 510 with that of the second comparator 530. The storage unit 540 includes two input terminals connected through the first comparator 510 and the second comparator 530, and each switch 550 and 560.

The I/O controller 600 includes a first path 610, a second path 620, a third path 630 and a fourth path 640. The first path 610 transmits data inputted from a data I/O buffer (not shown) into the storage unit 540. The second path 620 outputs data stored in the storage unit 540. The third path 630 transmits an output signal from the second path 620 into the data I/O buffer. The fourth path 640 transmits the output signal from the second path 620 into the data line.

The storage unit 540 stores output signals from the first comparator 510 and the second comparator 530 in a read mode, thereby performing a restore operation after the read operation. In a write mode, the storage unit 540 stores data transmitted from the first path 610, and transmit the data into data lines of the second path 620 and the fourth path 640, thereby allowing data to be written in the memory cell. Here, the restore operation is similarly performed to the write operation.

Figure 11B:
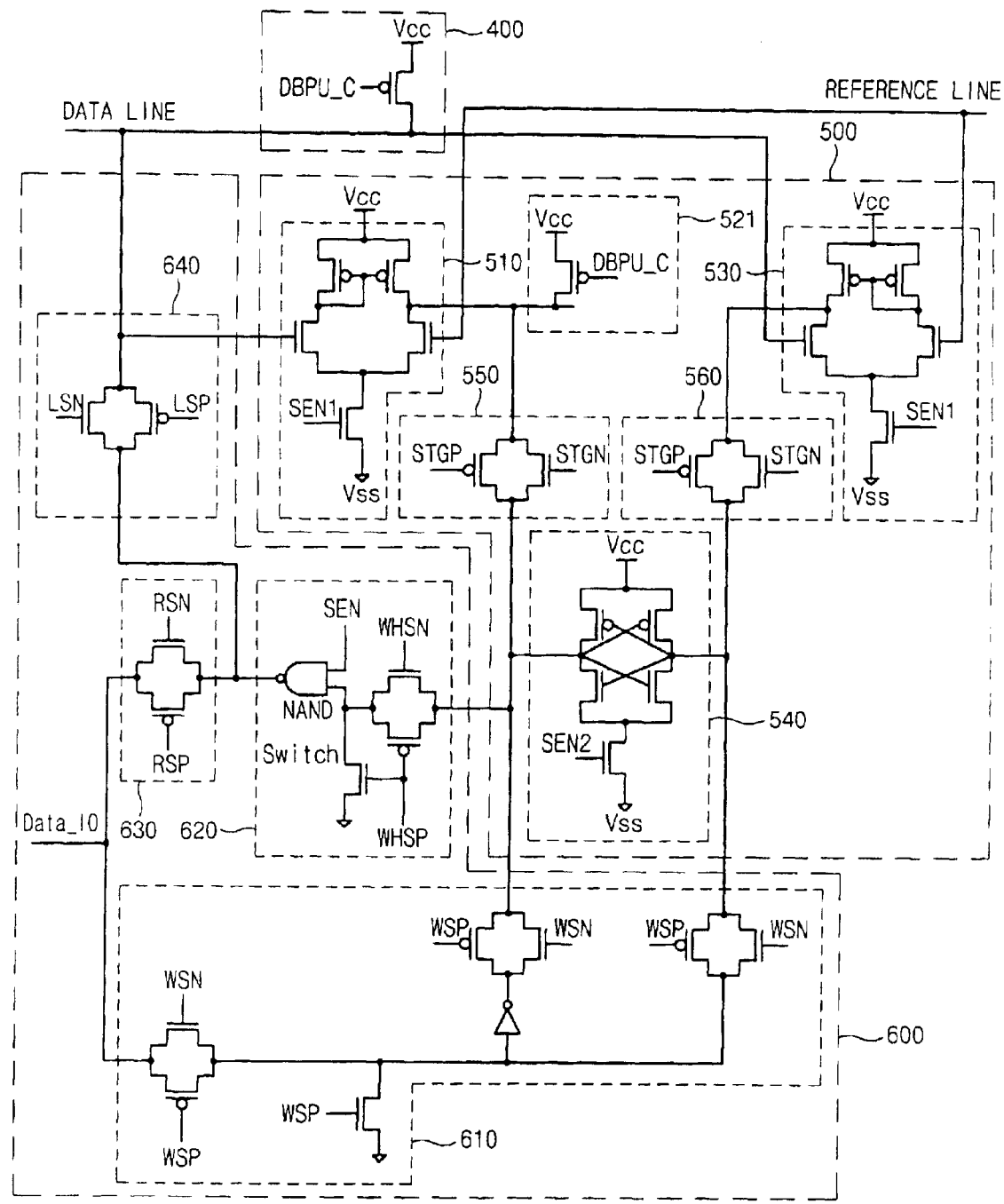

FIG. 11b is a circuit diagram illustrating another example of the sense amplifier 111 of FIG. 10. The major function of the example shown in FIG. 11b is the same as that of the sense amplifier shown in FIG. 11a. However, a PMOS transistor 521 is used herein instead of the equalizer 520 of FIG. 11a. The PMOS transistor 521 has a gate to receive a control signal identical with the control signal of the data line pull-up controller 400, a source connected to the VCC, and a drain connected to an output terminal of the first comparator 510.

Figure 12:
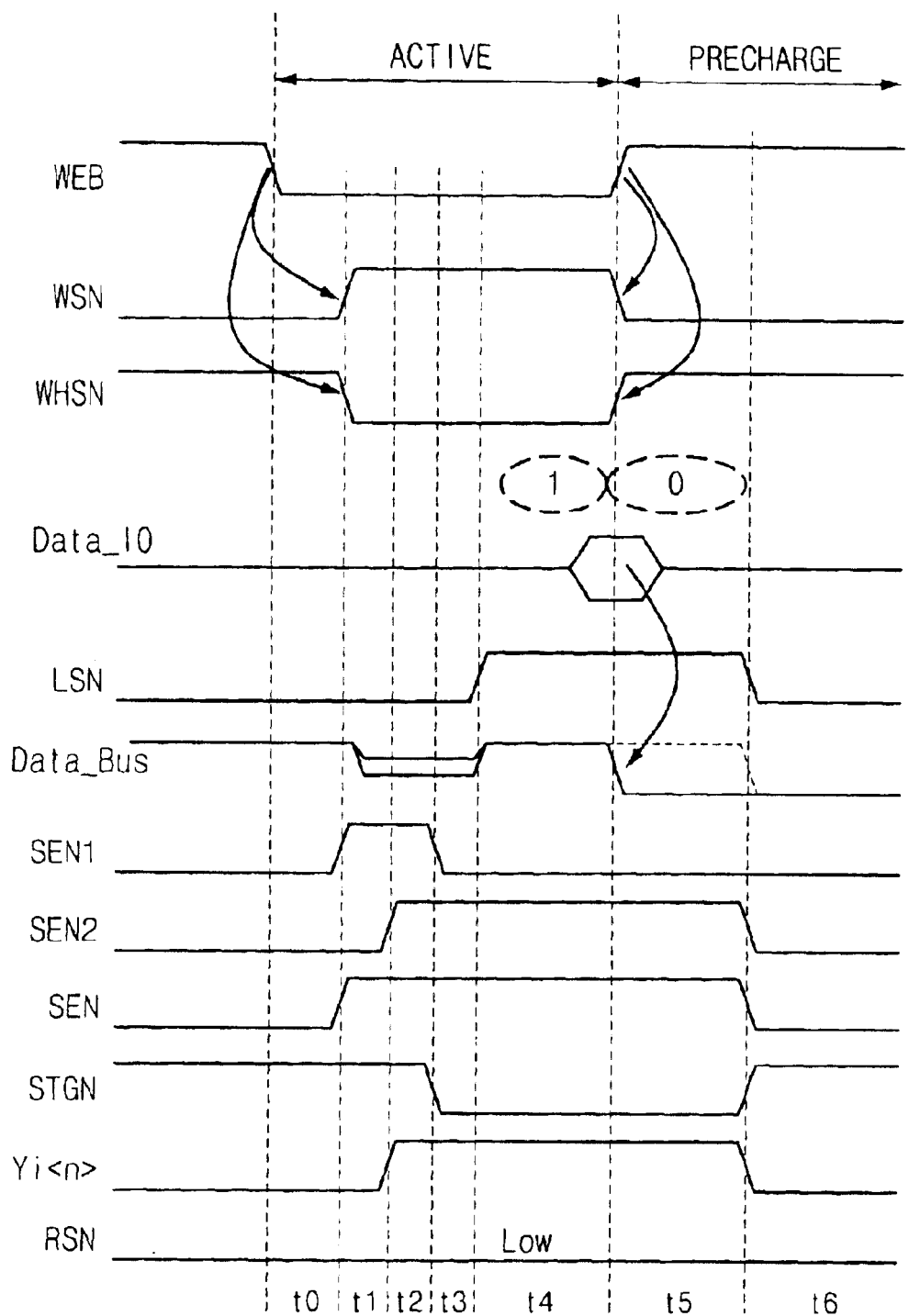
FIGS. 12 and 13 are timing diagrams of the sense amplifier of FIGS. 11a and 11b.
Figure 13:
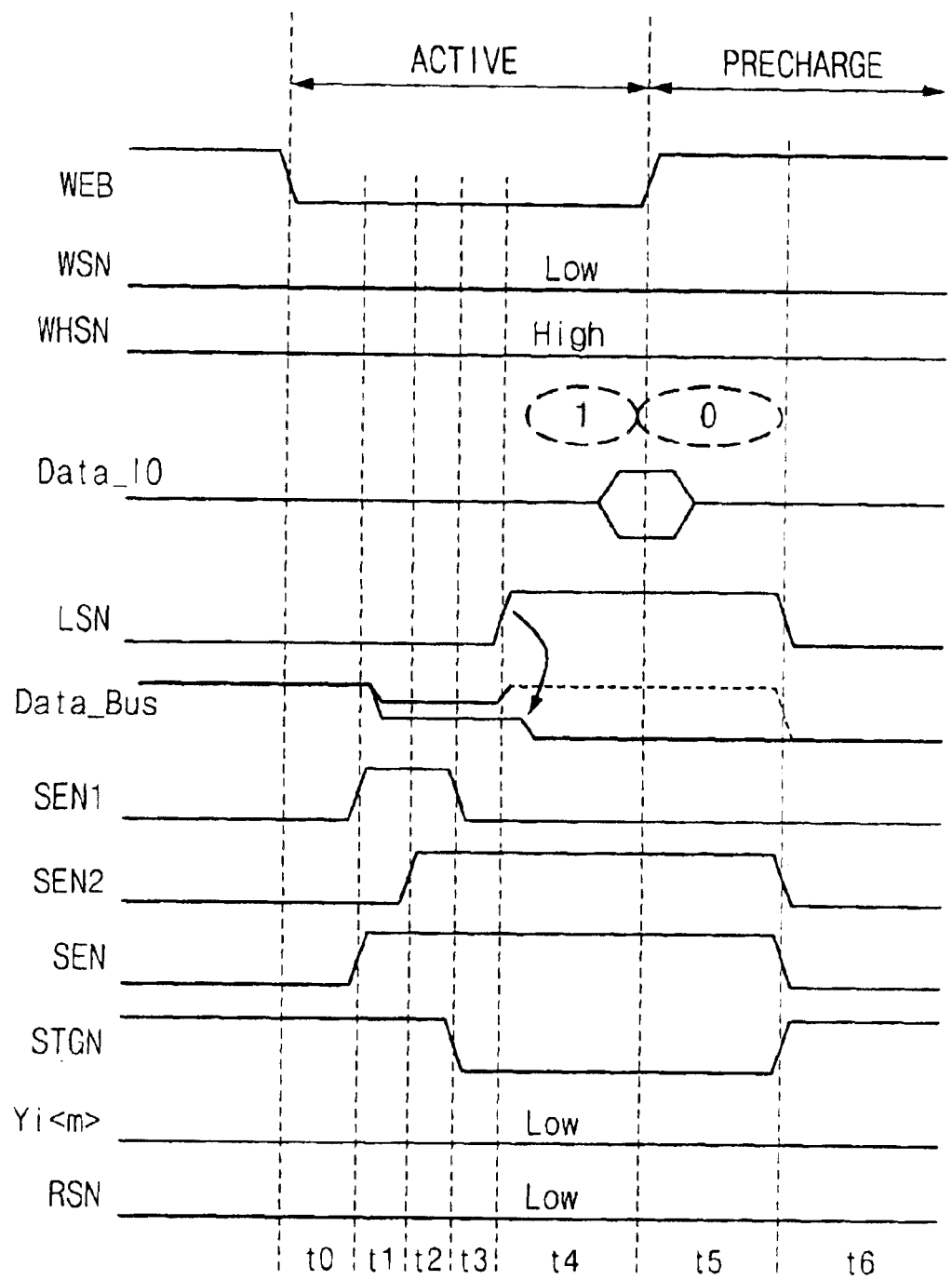

FIGS. 12 and 13 are timing diagrams of the sense amplifier of FIGS. 11a and 11b. FIG. 12 is a timing diagram illustrating a write mode when the column address bit Yi<n> is activated. FIG. 13 is a timing diagram illustrating a write mode when the column address bit Yi<n> is inactivated.

Referring to FIG. 12, if a write enable signal WEB is activated, a WSN becomes "high" and the first path 610 of FIG. 11a is activated. A WHSN becomes "low" and the second path 620 of FIG. 11a is inactivated (t0). Thereafter, SEN1, STGN and SEN2 are activated, and a signal of the data line is stored in the storage unit 540 of FIG. 11a (t2). If the column address bit Yi<n> is activated, the SEN2 and the switches 550 and 560 of FIG. 11a are inactivated. Next, data inputted in the I/O buffer is stored in the storage unit 540 of FIG. 11a (t3). If the WHSN becomes "high" and the second path is activated (t5), data stored in the storage unit 540 of FIG. 11a is outputted to the data line through the activated (t4) fourth path 640 of FIG. 11a.

Referring to FIG. 13, although the write enable signal WEB is activated, the WSN is maintained at a low level, and the first path 610 is inactivated. The WHSN is maintained at a high level, and the second path is activated. If the SEN1, the SEN2 and the STGN are activated, the value of the data line is read, and stored in the storage unit 540 (t2). Next, A LSN is activated, and the fourth path is activated (t4). Then, the value stored in the storage unit is outputted into the data line. That is, when the column address bit Yi<n> is not activated, the restore operation is only performed.

As described above, the global controller 170 generates a signal that is identically operated when the column address bit is selected and unselected. The local controller 180 generates that is not identically operated. Referring to FIGS. 12 and 13, the control signals SEN1, SEN2, LSN, LSP, STGN, STGP, SEQN and SEQP are generated from the global controller 170, and the control signals RSN, RSP, WSN, WSP, WHSN and WHSP are generated from the local controller 180.

Figure 14:
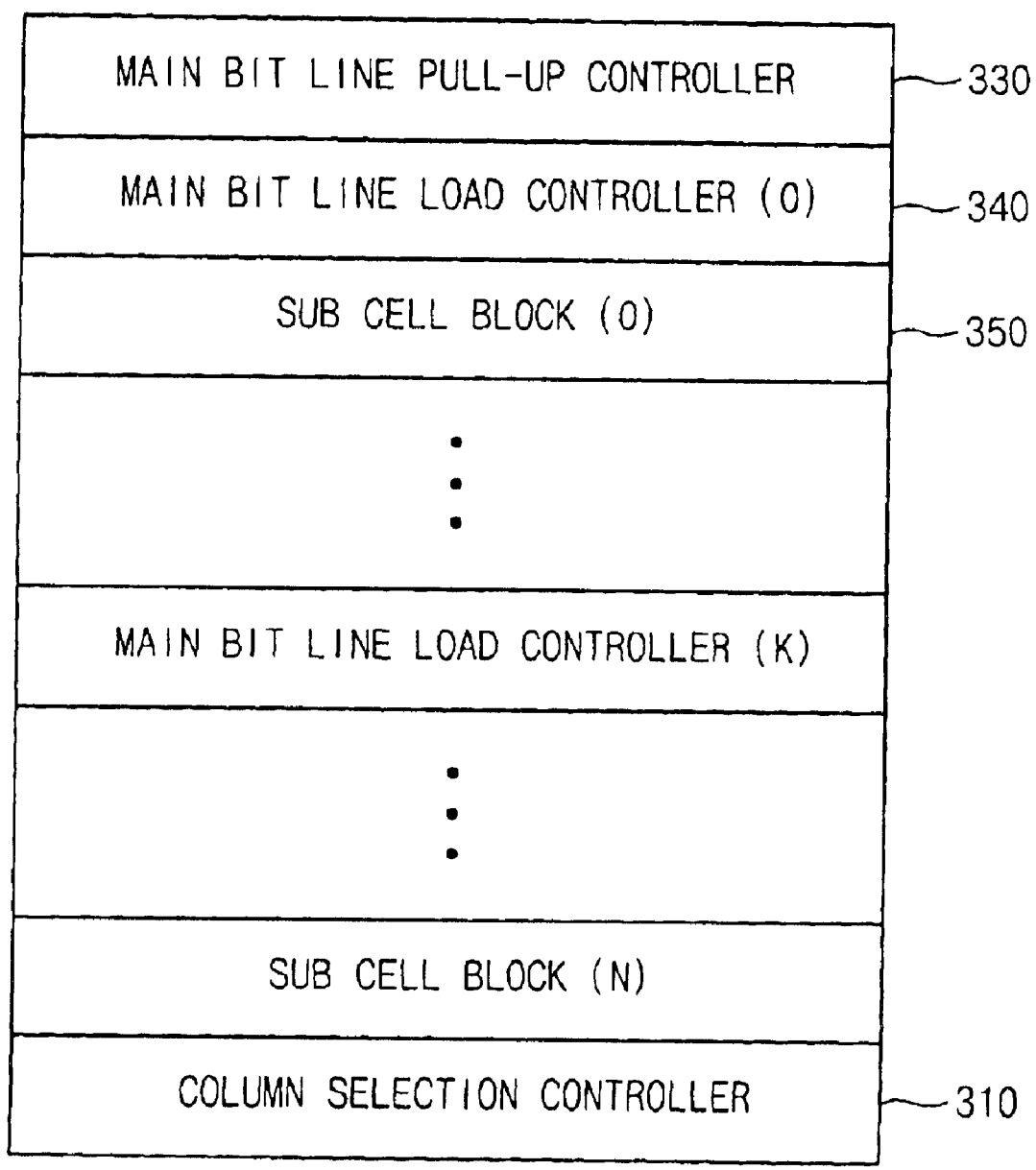
FIG. 14 is a structural diagram illustrating a cell array block of FIG. 4.

FIG. 14 is a structural diagram illustrating one of a plurality of unit blocks in a cell array block of FIG. 4.

Each unit block comprises a main bitline pull-up controller 330, a cell array, and a column selection controller 310. The cell array includes a main bitline load controller 340, and a plurality of sub cell blocks 350 connected in series between the main bitline pull-up controller 330 and the column selection controller 310.

Figure 15:
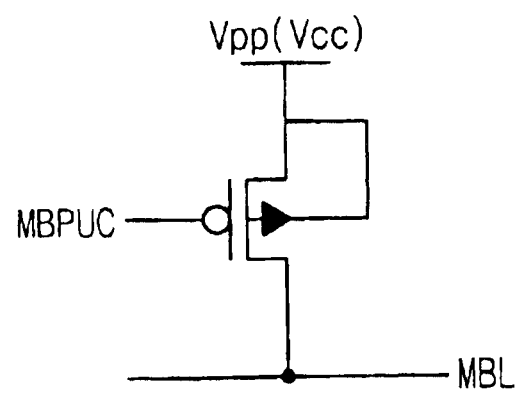
FIG. 15 is a circuit diagram illustrating a main bitline pull-up controller of FIG. 14.

FIG. 15 is a circuit diagram illustrating the main bitline pull-up controller 330 of FIG. 14. The main bitline pull-up controller 330 comprises a PMOS transistor having a gate connected to a control signal MBPUC, a source connected to a Vpp or a Vcc, and a drain connected to the main bitline 360. The main bitline pull-up controller 330 pulls up the main bitline to a "high" level in a "precharge" operation.

Figure 16:
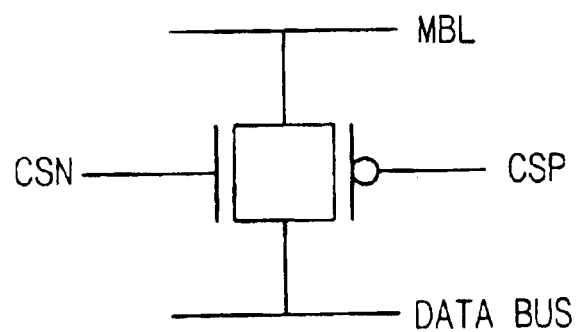
FIG. 16 is a circuit diagram illustrating a column selection controller of FIG. 14.

FIG. 16 is a circuit diagram illustrating the column selection controller 310 of FIG. 14. The column selection controller 310 comprises a transmission gate for connecting a main bitline to a data bus line in response to control signals CSN and CSP.

Figure 17:
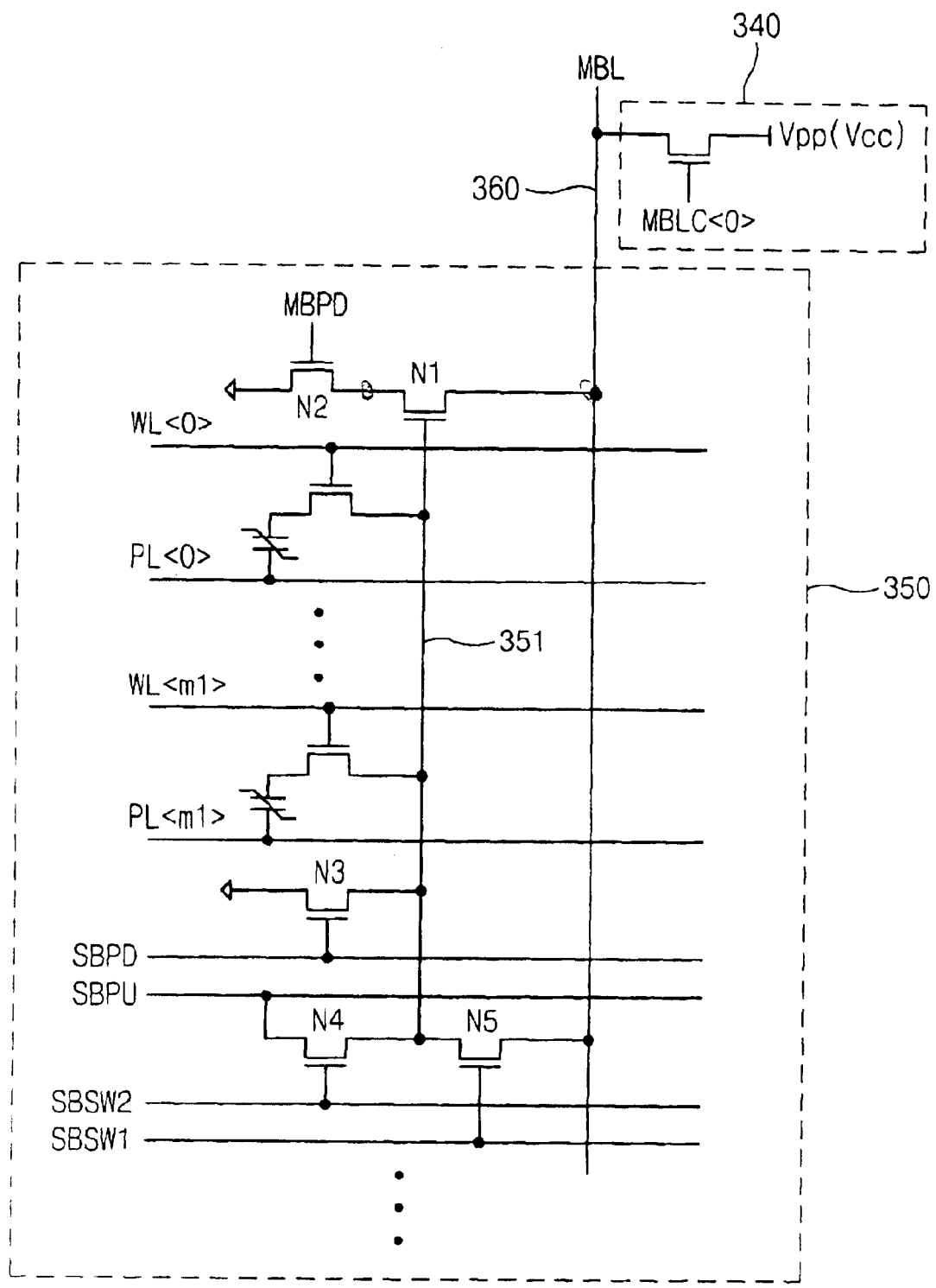
FIG. 17 is a circuit diagram illustrating a main bitline load controller and a sub cell block of FIG. 14.

FIG. 17 is a circuit diagram illustrating the main bitline load controller 340 and the sub cell block 350 of FIG. 14. Here, one sub cell block 350 is shown for convenience sake. The main bitline load controller 340 comprises a PMOS transistor having a gate connected to a control signal MBLC, a source connected to a Vpp or a Vcc, and a drain connected to the main bitline 360.

When the control signal MBLC is activated, the main bitline load controller 340 serves as load of the main bitline 360. A detection voltage of the main bitline 360 is determined by a load resistance and a current level of the main bitline 360. The current level is determined by a transistor N1. The main bitline load controller 340 may be attached to each main bitline. However, when a driving load is large, the main bitline load controller 340 is arranged in each sub cell block 350, thereby reducing driving load of each main bitline load controller 340.

The sub cell block 350 comprises a sub bitline 351, and NMOS transistors N1, N2, N3, N4 and N5. The sub bitline 351 is connected in common to a plurality of unit memory cells. Each unit memory cell is connected between a wordline WL<m> and a plateline PL<m>. The NMOS transistor N1 for regulating current has a gate connected to a first terminal of the sub bitline 351, and a drain connected to the main bitline 360. The NMOS transistor N2 has a gate connected to a control signal MBSW, a drain connected to a source of the NMOS transistor N1, and a source connected to ground. The NMOS transistor N3 has a gate connected to a control signal SBPD, a drain connected to a second terminal of the sub bitline 351, and a source connected to ground. The NMOS transistor N4 has a gate connected to a control signal SBSW2, a source connected to the second terminal of the sub bitline 351, and a drain connected to a control signal SBPU. The NMOS transistor N5 has a gate connected to a control signal SBSW1, a drain connected to the main bitline 360, and a source connected to the second terminal of the sub bitline 351.

The load of the main bitline may be reduced to that of the sub bitline 351 by activating one of a plurality of sub bitlines 351 in the main bitline 360. The sub bitline 351 is selected by the control signal SBSW1.

The sub bitline 351 regulates a potential of the sub bitline 351 to a ground level if the SBPD signal, which is a regulating signal of the pull-down NMOS transistor N3, is activated.

The SBPU signal regulates a power voltage to be supplied to the sub bitline 351. When a "high" voltage is required in a low voltage, a voltage higher than the VCc voltage is supplied to the sub bitline 351.

The control signal SBSW2 regulates a signal flow between the sub bitline SBL and the main bitline MBL. The sub bitline 351 is connected to a plurality of unit cells.

The sub bitline 351 is configured to be connected to the gate of the NMOS transistor N1 and to regulating a sensing voltage of the main bitline 360.

Figure 18A:
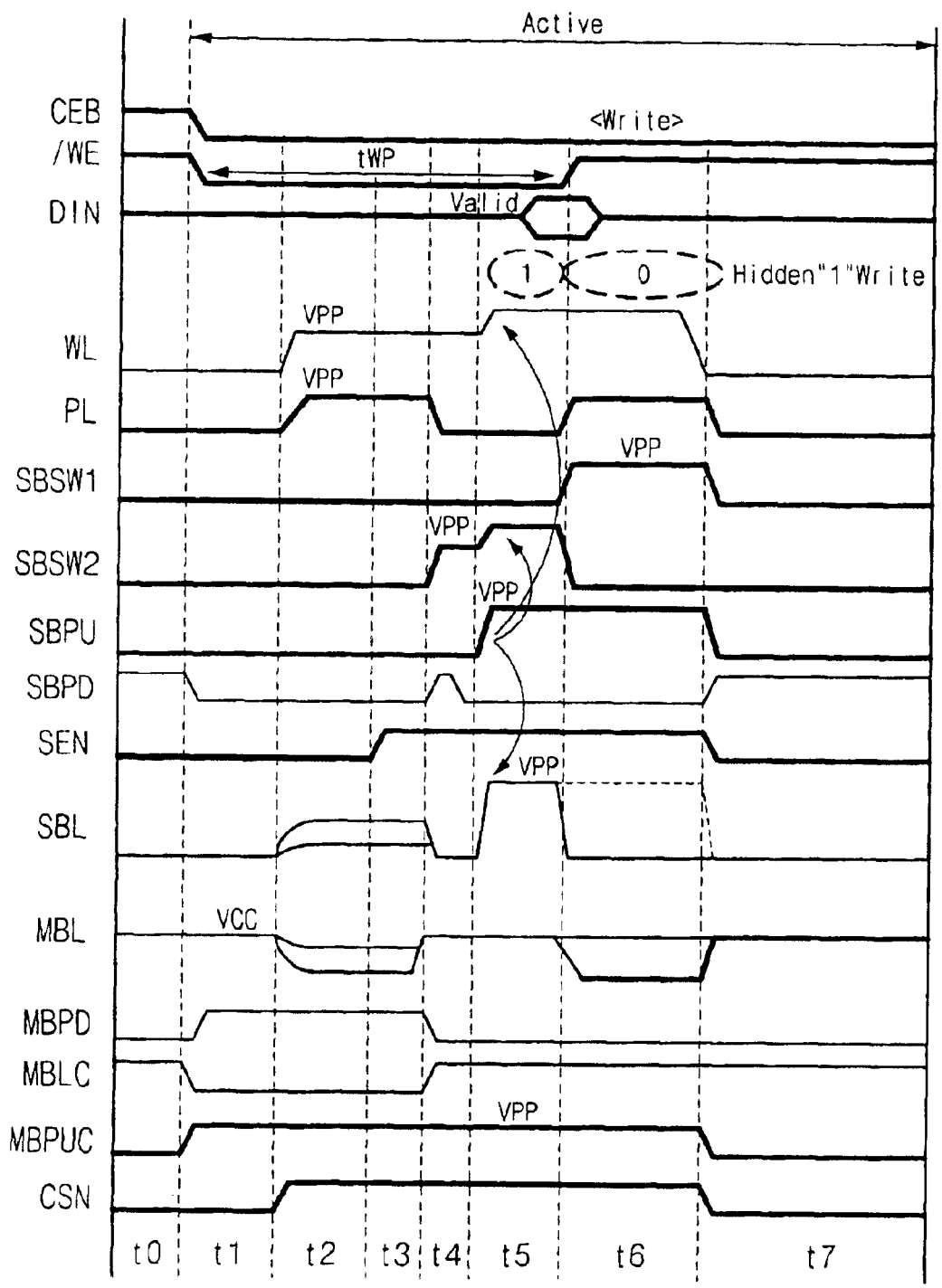
FIGS. 18a and 18b are timing diagrams illustrating read and write operations of the sub cell block of FIG. 17.

FIG. 18a is a timing diagram illustrating a write operation of the sub cell block of FIG. 17.

In intervals t2 and t3, a level of a signal written in a cell is detected. In an interval t4, a self-boosting operation is prepared. In an interval t5, a "high" level signal is written. In an interval t6, a "low" level signal is written.

In the intervals t2 and t3, if data of the cell is "high", a voltage of the sub bitline 351 becomes "high". As a result, as current flowing in the NMOS transistor N1 becomes larger, a voltage of the main bitline 360 becomes lower than the reference level. On the other hand, when the data of the cell is "low", the voltage of the sub bitline 351 becomes "low". As a result, as the current flowing in the NMOS transistor N1 becomes less, the voltage of the main bitline 360 becomes higher than the reference level. In this way, the data stored in the cell may be detected.

In the interval t4, if the SBSW2 becomes "high" at a state where the SBPU is maintained at a "low" level, charges are stored in parasitic capacitors between the gate and the source or the gate and the drain of the transistor N4. In the interval t5, if the SBPU becomes "high", potentials of the SBSW2, the sub bitline 351 and the wordline WL<I> are boosted as much as additional potential difference by the stored charges. As a result, data "1" is automatically stored in the cell.

If the data inputted to the main bitline 360 through the I/O buffer is "0", the SBSW1 is activated, and the SBSW2 is inactivated. Then, the potential of the plateline PL<i> becomes "high", and that of the sub bitline 351 also becomes "0". As a result, as the charges stored in the cell move into the sub bitline, the data "0" is written in the cell (t6).

Figure 18B:
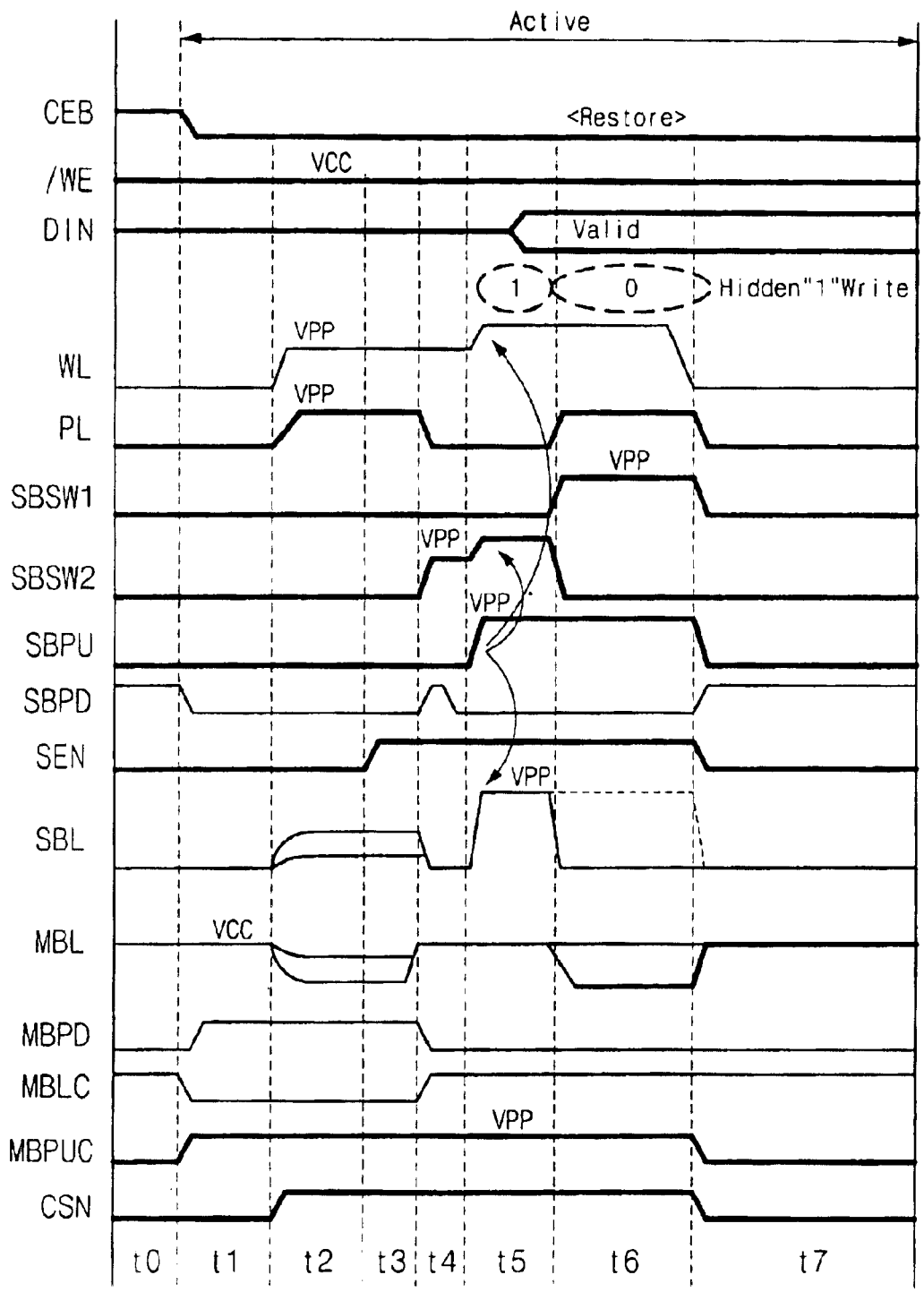

FIG. 18b is a timing diagram illustrating a read operation of the sub cell block of FIG. 17.

In intervals t2 and t3, a level of a signal written in a cell is detected. In an interval t5, a "high" level signal is written. In an interval t6, a "0" level signal is restored.

The operation in the intervals t2–t4 is identical with that of FIG. 18a. In general, a restore operation is required after a read operation. Referring to FIG. 18b, however, a restore operation is performed in the intervals t5 and t6. In the interval t5, data "1" is restored regardless of the originally stored value. In the interval t6, data "0" is restored. The explanation of the restore operation is omitted because it is the same as that of the write operation.

Figure 19:
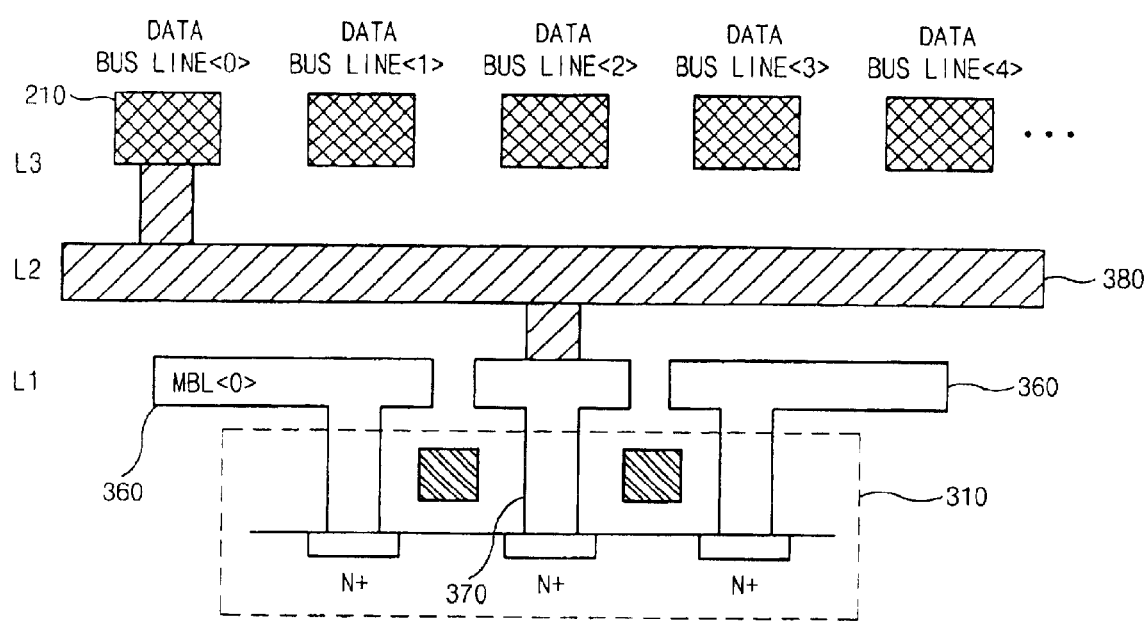
FIG. 19 is a layout of the connection portion between a data bus unit and a column selection controller according to the present invention.

FIG. 19 is a cross-sectional diagram illustrating the connection portion between a data bus unit and a column selection controller according to the present invention. The connection portion comprises a first layer L1, a second layer L2, and a third layer L3. The first layer L1 comprises two NMOS transistors having a common source and a common drain. The common source is connected to the main bitline 360, and the common drain is connected to a first shared layer 370. The second layer L2 includes a second shared layer for connecting the first shared layer 370 to the data bus line 210. The third layer L3 includes the data bus line 210.

The second shared layer 380 allows the area of the first shared layer 370 to be minimized. As a result, the increase in the area of the whole chip layout due to increase in that of the first shared layer 370 can be prevented. Additionally, the design of the above-described layout improves process margin and efficiency of signal transmission.

Figure 20:
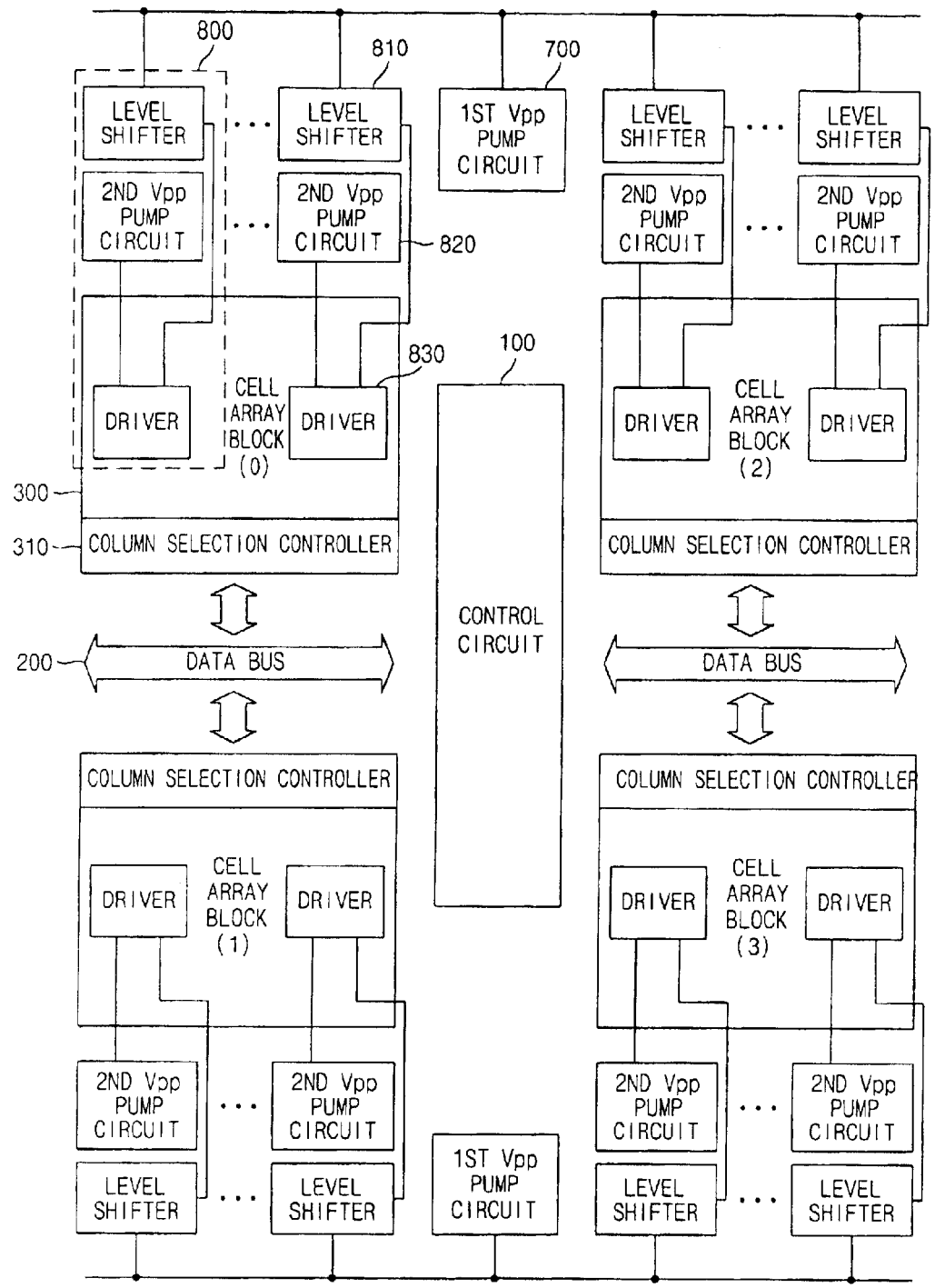
FIG. 20 is a block diagram illustrating a VPP supply circuit for supplying a VPP to a cell array block of the FRAM according to the present invention.

FIG. 20 is a block diagram illustrating a VPP supply circuit 700 for supplying a VPP to the cell array block of FIG. 4. Referring to FIG. 20, a plurality of VPP driving circuits 800 are arranged in each cell array block 300, and first VPP pump circuits 200 are arranged on top and bottom of the control circuit unit 100.

The VPP driving circuit 800 comprises a second VPP pump circuit 820, a level shifter 810, and a driver 830. The second VPP pump circuit 820 generates a gate VPP signal. The level shifter 810 level-shifts an output signal from the first VPP pump circuit. The driver 830, which is controlled by the gate VPP signal and an output signal from the level shifter 819, outputs a driving voltage.

The first VPP pump circuit 700 requires relatively larger layout size and operates at lower speed. Therefore, the first VPP pump circuit 700 is disposed in the middle of the VPP driving circuits 800 to effectively control a VPP level. However, the VPP driving circuit 800 operates at higher speed. As a result, the VPP driving circuit 800 is individually arranged in each unit block.

Figure 21:
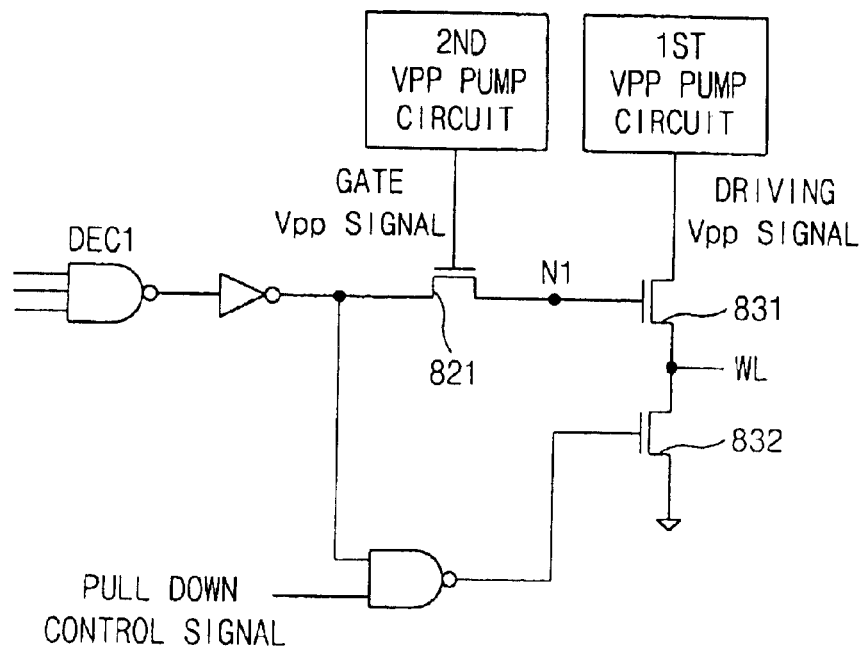
FIG. 21 is a structural diagram illustrating a VPP driving circuit of FIG. 20.

FIG. 21 is a structural diagram illustrating the VPP driving circuit 800 of FIG. 20.

The driver 830 comprises NMOS transistors 821 and 832. The NMOS transistor 832 has a source connected to ground, a drain to output a driving voltage, and a gate controlled by a result obtained from logical operation of a pull-down control signal and an output signal from the address decoder. The NMOS transistor 821 has a gate to receive the VPP (gate Vpp signal) supplied from the second VPP pump circuit 820, a source to receive the output signal from the address decoder, and a gate connected to a drain of a NMOS transistor 831 in a node N1.

A level shifter circuit comprises the NMOS transistor 831. The NMOS transistor 831 has a drain to receive the VPP (driving Vpp signal) outputted from the first VPP pump circuit, a source connected to a drain of the NMOS transistor 832, and the gate connected to the drain of the NMOS transistor 821.

Figure 22:
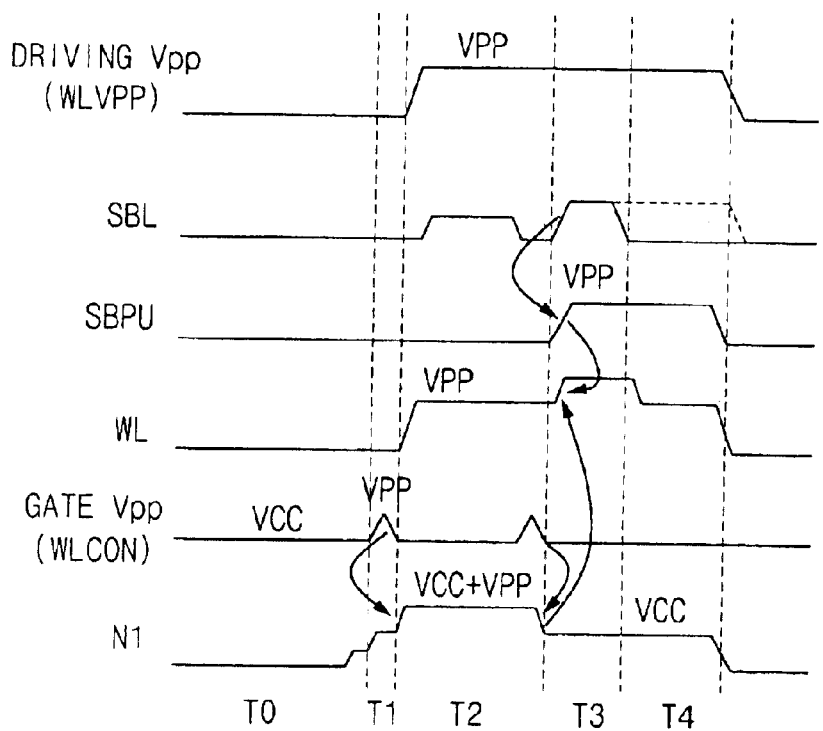
FIG. 22 is a timing diagram illustrating the operation of the VPP driving circuit of FIG. 21.

FIG. 22 is a timing diagram illustrating the operation of the VPP driving circuit 800 of FIG. 21. In the cell operation, the voltage VPP is outputted into the wordline, the plateline, the SBPU and SBSW2 (see FIG. 17). Referring to FIG. 22, in an interval T1, a signal WLCON as an output signal from the second VPP pump circuit 820 is to make the node N1 (see FIG. 21) at a VCC level. If a gate voltage of the NMOS transistor 821 rises to the VPP, a voltage smaller than the VPP is generated at the node N1. This value is represented by a VCC. Then, if the gate voltage of the NMOS transistor 821 becomes VCC, the NMOS transistor 821 is turned off and the node N1 becomes floating.

When an interval T2 starts, a driving VPP signal outputted from the first VPP pump circuit 700 becomes VPP. Here, the node N1 is boosted to VCC+VPP by charges stored in the parasitic capacitor between the node N1 and the drain of the NMOS transistor 831. Additionally, a wordline voltage becomes VPP because the NMOS transistor 831 is turned on.

The VPP of the WLCON signal in the final stage of the interval T2 turns on the NMOS transistor 821. As a result, the node N1 falls to the VCC level. Here, since the WLCON signal falls to the VCC again, the NMOS transistor 821 is turned off and the node N1 becomes floating. The voltage of the node N1 also becomes the VCC, and the NMOS transistor 831 is turned off. As a result, the wordline WL becomes floating. Here, a potential difference is maintained by charges stored in the parasitic capacitor between the floating wordline WL and the sub bitline 351. In this state, if the SBPU signal becomes "high", the sub bitline 351 becomes "high" (see FIGS. 17 and 18). Next, a boosting voltage is generated as much as the potential difference maintained between the wordline WL and the sub bitline 351 (T3).

What is claimed is:

1. A ferroelectric memory device, comprising:
   a cell array block having a bitline structure including a main bitline and a plurlaity of sub bitlines, the main bitline connected to a column selection controller, and the plurality of sub-bitlines having both terminals connected to the main bitline, respectively, and connected to a plurality of unit cells;
   a data bus unit connected to the column selection controller; and
   a control circuit unit including a sense amplifier array connected between a data I/O buffer and a sense amplifier data bus connected to the data bus unit,
   wherein a plurality of the cell array blocks are arranged like a matrix, the control circuit unit is disposed in a first center line of symmetry wherein the first center line is parallel to the main bitline, and the data bus unit is disposed in a second center line of symmetry wherein the second center line is vertical to the main bitline.

2. The device of claim 1, wherein a plurality of data bus lines included in the data bus unit are connected one by one to a plurality of the sense amplifier data bus line included in the sense amplifier data bus.

3. The device of claim 1, further comprising a first switch device and a second switch device connected apart in the middle of the data bus unit,
   wherein a plurality of the sense amplifier data bus lines in the sense amplifier data bus are connected one by one to a plurality of data bus lines in the data bus unit in a middle region of the first switch device and the second switch device, and electrically connected to one terminal of the data bus unit depending on complementary switching operations of the first and the second switches.

4. The device of claim 1, wherein the data bus unit includes a first data bus unit and a second data bus unit separately disposed from the first data bus unit,
   the sense amplifier data bus includes a first sense amplifier data bus connected to the first data bus unit and a second sense amplifier data bus connected the second data but unit,
   and each sense amplifier is selectively connected to a data bus line included in the first sense amplifier data bus or a data bus line included in the second sense amplifier data bus.

5. The device of claim 4, wherein the data bus lines in the first sense amplifier data bus and the second sense amplifier data bus are connected to the sense amplifier via the first switch device and the second switch device, respectively.

6. The device of one of claims 1 to 5, wherein the sense amplifier array includes:
   a plurality of sub sense amplifier arrays, each sub sense amplifier comprising a predetermined number of sense amplifiers;
   a plurality of local controllers for receiving a column address bit, and outputting a common control signal to a sense amplifier into the predetermined number of sub sense amplifier arrays; and
   a global controller for outputting a common control signal into all sense amplifiers in the sense amplifier array.

7. The device of claim 6, wherein the sense amplifier includes:
   a data line pull-up controller for pulling up a data line connected to the sense amplifier data bus line;
   an amplification unit for amplifying and storing data inputted into the data line in a read mode or data inputted into an I/O buffer in a write mode; and
   an I/O controller for outputting data stored in the amplification unit into the data line in a write mode or into the I/O buffer and the data line in a read mode.

8. The device of claim 7, wherein the amplification unit includes:
   a first comparator for comparing the reference signal with a signal of the data line, and outputting a signal of a high level when the signal of the data line has a higher level than the reference signal;

a second comparator for comparing the reference signal with a signal of the data line, and outputting a signal of an opposite level to the first comparator;

a storage unit including a first input terminal connected via an output terminal of the first comparator and a first transmission gate and a second input terminal connected via an output terminal of the second comparator and a second transmission gate, for storing signals inputted into the first and the second input terminals, wherein the first comparator, the second comparator, the first transmission gate, the second transmission gate and the storage unit are controlled by the global controller.

9. The device of claim 8, wherein the amplification unit further includes a switch connected between the output terminals of the first comparator and the second comparator, the switch controlled by the global controller.

10. The device of claim 8, wherein the amplification unit further includes a PMOS transistor for pulling up the output terminal of the first comparator when the data line is pulled up.

11. The device of claim 7, wherein the I/O controller includes:

a first path for outputting data inputted from the I/O buffer into the first input terminal of the storage unit, and a complementary value of the inputted data into the second input terminal of the storage unit;

a second path for outputting a value of the second input terminal of the storage unit;

a third path for outputting an output value from the second path into the I/O buffer; and a fourth path for outputting an output value from the second path, wherein the first path, the second path and the third path are controlled by the local controller, and the fourth path is controlled by the global controller.

12. The device of claim 1, wherein the cell array block includes:

a main bitline pull-up controller for pulling up the main bitline in response to a first control signal; and a cell array connected between the main bitline pull-up controller and the column selection controller.

13. The device of claim 12, wherein the cell array includes:

a main bitline load controller configured to be connected between a positive power and the main bitline, and to control flow of current in response to a second control signal; and a plurality of sub cell blocks configured to be arranged between the main bitline pull-up controller and the column selection controller, and to be connected to the main bitline in both terminals, respectively.

14. The device of claim 12, wherein the main bitline pull-up controller is a PMOS transistor having a gate to receive the first control signal, a source connected to a positive power and a drain connected to the main bitline.

15. The device of claim 13, wherein the main bitline load controller is connected one by one to the main bitline.

16. The device of claim 13, wherein a plurality of the main bitline load controllers are connected to each main bitline, and evenly placed apart from each other in a predetermined number of sub cell blocks.

17. The device of claim 13, wherein the sub cell block includes:

a first NMOS transistor having a gate connected to a first terminal of the sub bitline, and a drain connected to the main bitline;

a second NMOS transistor having a gate connected to a third control signal, a drain connected to a source of the first NMOS transistor, and a source connected to ground;

a third NMOS transistor having a gate connected to a fourth control signal, a drain connected to a second terminal of the sub bitline, and a source connected to ground;

a fourth NMOS transistor having a gate connected to a fifth control signal, a source connected to the second terminal of the sub bitline, and a drain connected to a sixth control signal; and a fifth NMOS transistor having a gate connected to a seventh control signal, a drain connected to the main bitline, and a source connected to the second terminal of the sub bitline.

18. The device of one of claims 12 to 17, wherein the connection portion between the column selection controller and the data bus unit includes:

a first layer including the column selection controller having a source connected to the main bitline and a drain connected to a first shared layer;

a second layer including a second shared layer for connecting the first shared layer to a data bus line of the data bus unit; and a third layer including the data bus unit, wherein the second layer is disposed below the first layer and the third layer is disposed below the second layer.

19. The device of claim 1, wherein the ferroelectric memory device further includes:

a first VPP pump circuit; and a plurality of VPP driving circuits for receiving a VPP from the first VPP pump circuit and outputting the VPP into the cell array block, wherein the first VPP pump circuit is arranged adjacent to the VPP driving circuit in both end portions of the control circuit unit, and the plurality of the VPP driving circuits are arranged symmetrically with respect to the first VPP pump circuit in each cell array block.

20. The device of claim 19, wherein the VPP driving circuit includes:

a second VPP pump circuit for outputting a gate VPP signal;

a first NMOS transistor having a gate to receive the gate VPP signal outputted from the second VPP pump circuit, and a source to receive an output signal of an address decoder;

a second NMOS transistor having a gate connected to a drain of the first NMOS transistor, and a drain to receive the VPP outputted from the first VPP pump circuit; and a third NMOS transistor configured to have a gate controlled by a pull-down control signal and the output signal of the address decoder, a source connected to ground and a drain connected to a source of the second NMOS transistor, and to output a voltage from the drain as a driving voltage.

* * * * *